(12) United States Patent
Munshi et al.

(10) Patent No.: US 12,471,405 B2
(45) Date of Patent: Nov. 11, 2025

(54) COMPOSITION OF MATTER

(71) Applicant: CRAYONANO AS, Trondheim (NO)

(72) Inventors: Mazid Munshi, Trondheim (NO);
Helge Weman, Ecublens (CH);
Bjorn-Ove M. Fimland, Trondheim (NO)

(73) Assignee: Squidled SAS, Paris (FR)

( * ) Notice: Subject to any disclaimer, the term of this patent is extended or adjusted under 35 U.S.C. 154(b) by 648 days.

(21) Appl. No.: 17/761,368

(22) PCT Filed: Sep. 23, 2020

(86) PCT No.: PCT/EP2020/076631
§ 371 (c)(1),
(2) Date: Mar. 17, 2022

(87) PCT Pub. No.: WO2021/058605
PCT Pub. Date: Apr. 1, 2021

(65) Prior Publication Data
US 2022/0352398 A1    Nov. 3, 2022

(30) Foreign Application Priority Data

Sep. 23, 2019   (GB) ..................................... 1913701
Jul. 16, 2020   (WO) ................. PCT/EP2020/070228

(51) Int. Cl.
*H10H 20/812*   (2025.01)
*H10F 71/00*    (2025.01)
(Continued)

(52) U.S. Cl.
CPC ..... *H10F 77/1437* (2025.01); *H10F 71/1276* (2025.01); *H10F 77/12485* (2025.01);
(Continued)

(58) Field of Classification Search
CPC ... H01L 33/005; H01L 33/0008; H01L 33/06;
H01L 33/08; H01L 29/66015;
(Continued)

(56) References Cited

U.S. PATENT DOCUMENTS 4,213,801 A    7/1980   Johnston
7,335,908 B2   2/2008   Samuelson et al.
(Continued)

FOREIGN PATENT DOCUMENTS

CN    101504961   8/2009
CN    101710567   5/2010
(Continued)

OTHER PUBLICATIONS

International Search Report and Written Opinion for PCT/EP2020/076631 written on Dec. 10, 2020, 15 pages.
(Continued)

*Primary Examiner* — Eduardo A Rodela
(74) *Attorney, Agent, or Firm* — Meunier Carlin & Curfman LLC

(57) ABSTRACT

A composition of matter comprising: a plurality of group III-V nanowires or nanopyramids epitaxially grown on a polycrystalline or single-crystalline graphene layer, said graphene layer being directly supported on a crystalline substrate such as a group III-V semiconductor, sapphire, SiC or diamond substrate, wherein the epitaxy, crystal orientation and facet orientations of said nanowires or nanopyramids are directed by the crystalline substrate.

15 Claims, 15 Drawing Sheets

(51) Int. Cl.
  *H10F 77/124* (2025.01)
  *H10F 77/14* (2025.01)
  *H10F 77/164* (2025.01)
  *H10H 20/01* (2025.01)
  *H10H 20/825* (2025.01)

(52) U.S. Cl.
  CPC ......... *H10F 77/146* (2025.01); *H10F 77/164* (2025.01); *H10H 20/01335* (2025.01); *H10H 20/812* (2025.01); *H10H 20/8252* (2025.01)

(58) Field of Classification Search
  CPC ....... H01L 31/035227; H01L 31/03048; H01L 31/035236; H01L 31/0368; H01L 31/1852; H01L 33/007; H01L 33/325; H01L 21/02444; H01L 21/02538; H01L 21/02603; H10H 20/01; H10H 20/81; H10H 20/812; H10H 29/8517; H10H 20/01335; H10H 20/8252; H10D 48/882; H10F 77/1437; H10F 71/1276; H10F 77/12485; H10F 77/146; H10F 77/164
  See application file for complete search history.

(56) References Cited

U.S. PATENT DOCUMENTS

| | | | |
|---|---|---|---|
| 7,442,575 B2 | 10/2008 | Coffer et al. | |
| 7,594,982 B1 | 9/2009 | Sager et al. | |
| 7,608,147 B2 | 10/2009 | Samuelson et al. | |
| 7,608,472 B2 | 10/2009 | Ichinose et al. | |
| 7,911,035 B2 | 3/2011 | Seifert et al. | |
| 7,939,404 B2 * | 5/2011 | Jang | C01B 32/16 257/E21.648 |
| 7,965,960 B2 | 6/2011 | Kim et al. | |
| 7,968,359 B2 | 6/2011 | Hersee | |
| 8,030,108 B1 * | 10/2011 | Lee | H01L 21/02639 438/42 |
| 8,039,860 B2 * | 10/2011 | Moon | H01L 33/382 257/E33.056 |
| 8,043,942 B2 | 10/2011 | Lee et al. | |
| 8,212,335 B2 | 7/2012 | Fujioka | |
| 8,415,682 B2 | 4/2013 | Nakanishi et al. | |
| 8,417,153 B2 | 4/2013 | Kim et al. | |
| 8,440,350 B1 | 5/2013 | Verbrugge et al. | |
| 8,455,284 B2 | 6/2013 | Seong et al. | |
| 8,519,378 B2 | 8/2013 | Hiruma et al. | |
| 8,519,387 B2 | 8/2013 | Endo et al. | |
| 8,669,574 B2 * | 3/2014 | Konsek | H01L 33/62 977/762 |
| 8,916,850 B2 | 12/2014 | Yi et al. | |
| 9,000,449 B2 | 4/2015 | Fujioka et al. | |
| 9,093,607 B2 * | 7/2015 | Gilet | H01L 33/28 |
| 9,419,176 B2 | 8/2016 | Hwang et al. | |
| 9,478,702 B2 * | 10/2016 | Hwang | G02B 6/0073 |
| 9,525,100 B2 * | 12/2016 | Yoo | H01L 33/08 |
| 9,525,102 B2 * | 12/2016 | Cha | H01L 33/24 |
| 9,577,176 B1 | 2/2017 | Fong et al. | |
| 9,666,673 B2 | 5/2017 | Yi et al. | |
| 9,705,030 B2 * | 7/2017 | Kneissl | H01L 33/06 |
| 9,978,808 B2 | 5/2018 | Schneider et al. | |
| 9,985,150 B2 | 5/2018 | Yoshimuta et al. | |
| 10,243,104 B2 | 3/2019 | Weman et al. | |
| 10,347,781 B2 * | 7/2019 | Weman | H01L 31/1828 |
| 10,573,781 B1 * | 2/2020 | Munkholm | H01L 33/10 |
| 11,038,083 B2 | 6/2021 | Singer et al. | |
| 11,404,182 B2 | 8/2022 | Yun et al. | |
| 2002/0175408 A1 | 11/2002 | Majumdar et al. | |
| 2003/0044608 A1 | 3/2003 | Yoshizawa et al. | |
| 2004/0075464 A1 | 4/2004 | Samuelson et al. | |
| 2005/0217565 A1 | 10/2005 | Lahreche et al. | |
| 2005/0217656 A1 | 10/2005 | Bender et al. | |
| 2006/0054909 A1 | 3/2006 | Shin et al. | |
| 2006/0125056 A1 | 6/2006 | Samuelson et al. | |
| 2006/0188774 A1 | 8/2006 | Niu et al. | |
| 2007/0177138 A1 | 8/2007 | Esmaeili | |
| 2007/0177139 A1 | 8/2007 | Kamins et al. | |
| 2007/0212538 A1 | 9/2007 | Niu | |
| 2007/0240757 A1 | 10/2007 | Ren et al. | |
| 2008/0036038 A1 | 2/2008 | Hersee et al. | |
| 2008/0081439 A1 | 4/2008 | Coffer et al. | |
| 2008/0118999 A1 | 5/2008 | Komada | |
| 2008/0142066 A1 | 6/2008 | Plissonnier et al. | |
| 2008/0142926 A1 | 6/2008 | Seifert et al. | |
| 2008/0191317 A1 | 8/2008 | Cohen et al. | |
| 2009/0057649 A1 | 3/2009 | Sutter et al. | |
| 2009/0159907 A1 | 6/2009 | Wang | |
| 2009/0176159 A1 | 7/2009 | Zhamu et al. | |
| 2009/0200540 A1 | 8/2009 | Bjoerk et al. | |
| 2009/0235862 A1 | 9/2009 | Cha et al. | |
| 2009/0293946 A1 | 12/2009 | Lin et al. | |
| 2010/0029037 A1 | 2/2010 | Tokuda et al. | |
| 2010/0035412 A1 | 2/2010 | Samuelson et al. | |
| 2010/0155702 A1 | 6/2010 | Wernersson et al. | |
| 2010/0171096 A1 | 7/2010 | Sutter et al. | |
| 2010/0200839 A1 | 8/2010 | Okai et al. | |
| 2010/0252808 A1 | 10/2010 | Samuelson et al. | |
| 2010/0314617 A1 | 12/2010 | Ito et al. | |
| 2010/0320445 A1 | 12/2010 | Ogihara et al. | |
| 2010/0327258 A1 | 12/2010 | Lee et al. | |
| 2011/0030772 A1 | 2/2011 | Veerasamy | |
| 2011/0030991 A1 | 2/2011 | Veerasamy et al. | |
| 2011/0081500 A1 | 4/2011 | Zhao et al. | |
| 2011/0083713 A1 | 4/2011 | Narducci | |
| 2011/0121264 A1 | 5/2011 | Choi et al. | |
| 2011/0129675 A1 | 6/2011 | Choi et al. | |
| 2011/0133061 A1 | 6/2011 | Yu et al. | |
| 2011/0148284 A1 | 6/2011 | Nagao et al. | |
| 2011/0163292 A1 | 7/2011 | Wang et al. | |
| 2011/0168256 A1 | 7/2011 | Wang et al. | |
| 2011/0174626 A1 | 7/2011 | Hamada et al. | |
| 2011/0175059 A1 | 7/2011 | Kahen et al. | |
| 2011/0175126 A1 | 7/2011 | Yang et al. | |
| 2011/0177683 A1 | 7/2011 | Kahen et al. | |
| 2011/0203651 A1 | 8/2011 | Nagao et al. | |
| 2011/0220171 A1 | 9/2011 | Mathai et al. | |
| 2011/0220864 A1 | 9/2011 | Kim et al. | |
| 2011/0239932 A1 | 10/2011 | Chang et al. | |
| 2011/0240099 A1 | 10/2011 | Ellinger et al. | |
| 2011/0254034 A1 | 10/2011 | Konsek et al. | |
| 2011/0260325 A1 | 10/2011 | Koto | |
| 2011/0272723 A1 | 11/2011 | Ha et al. | |
| 2011/0291068 A1 | 12/2011 | Kobayashi | |
| 2011/0313194 A1 | 12/2011 | Lee et al. | |
| 2012/0021554 A1 | 1/2012 | Neel et al. | |
| 2012/0041246 A1 | 2/2012 | Scher et al. | |
| 2012/0056237 A1 | 3/2012 | Choi et al. | |
| 2012/0068122 A1 | 3/2012 | Kranbuehl et al. | |
| 2012/0068153 A1 | 3/2012 | Seong et al. | |
| 2012/0068157 A1 | 3/2012 | Kub et al. | |
| 2012/0087422 A1 | 4/2012 | Zhou et al. | |
| 2012/0090057 A1 | 4/2012 | Cohen et al. | |
| 2012/0121891 A1 | 5/2012 | Kim et al. | |
| 2012/0132930 A1 | 5/2012 | Young et al. | |
| 2012/0135158 A1 | 5/2012 | Freer et al. | |
| 2012/0141799 A1 | 6/2012 | Kub et al. | |
| 2012/0145549 A1 | 6/2012 | Cho et al. | |
| 2012/0192931 A1 | 8/2012 | Jeon et al. | |
| 2012/0211073 A1 | 8/2012 | Nagao et al. | |
| 2012/0241192 A1 | 9/2012 | Cai et al. | |
| 2012/0270054 A1 | 10/2012 | Hong et al. | |
| 2013/0026468 A1 | 1/2013 | Yoshimuta et al. | |
| 2013/0137220 A1 | 5/2013 | Matsubara et al. | |
| 2013/0153860 A1 | 6/2013 | Kim et al. | |
| 2013/0158322 A1 | 6/2013 | Nyce et al. | |
| 2013/0187128 A1 * | 7/2013 | Yi | H01L 33/005 438/47 |
| 2013/0200424 A1 * | 8/2013 | An | H01L 29/06 438/479 |
| 2013/0207075 A1 | 8/2013 | Myers et al. | |
| 2013/0213470 A1 | 8/2013 | Yi et al. | |
| 2013/0221322 A1 | 8/2013 | Ohlsson et al. | |
| 2013/0221385 A1 | 8/2013 | Shibata et al. | |
| 2013/0231470 A1 | 9/2013 | Iacobelli | |

(56) References Cited

U.S. PATENT DOCUMENTS

| | | |
|---|---|---|
| 2013/0280894 A1 | 10/2013 | Lee et al. |
| 2013/0334497 A1 | 12/2013 | Weman et al. |
| 2014/0014171 A1 | 1/2014 | Alam et al. |
| 2014/0021444 A1 | 1/2014 | Yi et al. |
| 2014/0077156 A1 | 3/2014 | Bavencove et al. |
| 2014/0080234 A1 | 3/2014 | Lin et al. |
| 2014/0151826 A1 | 6/2014 | Kelber et al. |
| 2014/0161730 A1 | 6/2014 | Sitharaman et al. |
| 2014/0182668 A1 | 7/2014 | Pacifici et al. |
| 2014/0231745 A1 | 8/2014 | Northrup et al. |
| 2014/0252316 A1 | 9/2014 | Yan et al. |
| 2014/0293164 A1 | 10/2014 | Kim et al. |
| 2015/0014631 A1 | 1/2015 | Ohlsson et al. |
| 2015/0076450 A1 | 3/2015 | Weman et al. |
| 2015/0194549 A1 | 7/2015 | Fimland et al. |
| 2015/0221823 A1 | 8/2015 | Hwang et al. |
| 2015/0255677 A1 | 9/2015 | Dechoux et al. |
| 2015/0311363 A1 | 10/2015 | Park et al. |
| 2016/0005751 A1 | 1/2016 | Tsui et al. |
| 2016/0013365 A1 | 1/2016 | Chun et al. |
| 2016/0268128 A1 | 9/2016 | Cheng et al. |
| 2018/0204976 A1 | 7/2018 | Kim et al. |
| 2018/0204977 A1 | 7/2018 | Dheeraj et al. |
| 2018/0226242 A1 | 8/2018 | Kim et al. |
| 2018/0261624 A1 | 9/2018 | Ishikura et al. |
| 2019/0189840 A1 | 6/2019 | Tsai |
| 2020/0286786 A1* | 9/2020 | Kim ................. H01L 21/02392 |

FOREIGN PATENT DOCUMENTS

| | | |
|---|---|---|
| CN | 102254969 | 11/2011 |
| CN | 102376817 | 3/2012 |
| CN | 103050498 | 4/2013 |
| CN | 103903973 | 7/2014 |
| CN | 107785355 | 3/2018 |
| CN | 109003883 A | 12/2018 |
| CN | 109003888 A | 12/2018 |
| CN | 110246913 A | 9/2019 |
| EP | 1829141 | 9/2007 |
| EP | 1952467 | 8/2008 |
| EP | 2267796 | 12/2010 |
| GB | 2517186 | 2/2015 |
| JP | 2002280610 | 9/2002 |
| JP | 2007051327 | 3/2007 |
| JP | 2009010012 | 1/2009 |
| JP | 2012250868 | 12/2012 |
| JP | 2013129548 | 7/2013 |
| JP | 2014-506222 | 3/2014 |
| JP | 2014120548 | 6/2014 |
| KR | 20090003840 | 1/2009 |
| KR | 20100094228 | 8/2010 |
| KR | 20110061492 | 6/2011 |
| KR | 20120035841 | 4/2012 |
| KR | 20120036129 | 4/2012 |
| KR | 20120083084 A | 7/2012 |
| KR | 20120092431 | 8/2012 |
| KR | 101517551 | 5/2015 |
| KR | 20150142744 A | 12/2015 |
| WO | 2006062947 | 6/2006 |
| WO | 2007061945 | 4/2009 |
| WO | 2010056061 | 5/2010 |
| WO | 2010056064 | 5/2010 |
| WO | 2010096035 | 8/2010 |
| WO | 2011016837 | 2/2011 |
| WO | 2011081440 | 7/2011 |
| WO | 2011090863 | 7/2011 |
| WO | 2011160051 | 12/2011 |
| WO | 2012029381 | 3/2012 |
| WO | 2012080252 A1 | 6/2012 |
| WO | 2013094804 A1 | 6/2013 |
| WO | 2013104723 A1 | 7/2013 |
| WO | 2013121289 | 8/2013 |
| WO | 2013190128 | 12/2013 |
| WO | 2013190128 A2 | 12/2013 |
| WO | 2014202796 | 12/2014 |
| WO | 2015022414 | 2/2015 |
| WO | 2017009394 A1 | 1/2017 |
| WO | 2017009395 | 1/2017 |
| WO | 2017021380 | 2/2017 |
| WO | 2017044577 A1 | 3/2017 |
| WO | 2018141974 A1 | 8/2018 |
| WO | 2018189205 | 10/2018 |
| WO | 2019099461 A1 | 5/2019 |

OTHER PUBLICATIONS

Puybaret Renayud, et al. "Nanoselective area growth of GaN by metalorganic vapor phase epitaxy on 4H-SiC using epitaxial graphene as a mask", Applied Physics Letters, A I P Publishing LLC, US, vol. 108, No. 10, Mar. 7, 2016.

Kim et al. Remote epitaxy through graphene enables two-dimensional material-based layer transfer, Nature, 2017, 544, 340-343.

Jeong et al. Remote heteroepitaxy across graphene: Hydrothermal growth of vertical ZnO microrods on graphene-coated GaN substrate, Appl. Phys. Lett. 2018, 113, 233103.

Lu et al. Remote epitaxy of copper on sapphire through monolayer graphene buffer. Nanotechnology, 2018, 29, 445702.

Feng et al. Epitaxy of Single-Crystalline GaN Film on CMOS-Compatible Si(100) Substrate Buffered by Graphene. Adv. Funct. Mater. 2019, 29, 1905056.

Kent et al. Deep ultraviolet emitting polarization induced nanowire light emitting diodes with AlxGa1—xN active regions. Nanotechnology, 2014, 25, 455201.

Kishino et al. Improved Ti-mask selective-area growth (SAG) by rf-plasma-assisted molecular beam epitaxy demonstrating extremely uniform GaN nanocolumn arrays. Journal of Crystal Growth, 2009, 311(7), 2063-2068.

"Nanocomposite Thin Films and Coatings-Processing, Properties, Performance, Table 2.1. The Physical, Mechanical and Thermal Properties of Hard Materials, 2007, World Scientific.", 4 pages.

Bonaccorsco et al., Graphene photonics and optoelectronics, Nature Photonics, 2010, 4,611.

Boukhvalov et al., Chemical functionalization of graphene with defects, Nano Letters, 2008, 8(12), 4373-4379.

Chung et al., Transferable GaN Layers Grown on ZnO-Coated Graphene Layers for Optoelectronic Devices, Science, 2010, 330, 655-657.

Cohin et al. Growth of Vertical GaAs Nanowires on an Amorphous Substrate via a Fiber-Textured Si Platform, Nano letters 2013, 13, 2743.

Colombo et al., Ga-assisted catalyst-free growth mechanism of GaAs nanowires by molecular beam epitaxy, Phys Rev B, 2008, 77, 155326.

Dheeraj et al., Controlling crystal phases in GaAs nanowires grown by Au-assisted molecular beam epitaxy, Nanotechnology, 2013, 24, 015601.

Gao et al., Repeated growth and bubbling transfer of graphene with millimetre-size single-crystal grains using platinum, Nat Commun 2012, 3, 699.

Heib et al., Growth mechanisms and optical properties of GaAs-based semiconductor microstructures by selective area epitaxy, Journal of Crystal Growth, 2008, 310, 1049-1056.

Hong et al., Controlled can der Waals Heteroepitaxy of InAs Nanowires on Carbon Honeycomb Lattices, ACS Nano, 2011, 5(9), 7576-7584.

Huh et al., UV/Ozone-Oxidized Large-Scale Graphene Platform with Large Chemical Enhancement in Surface-Enhanced Raman Scattering, ACS Nano, 2011, 5(12), 9799-9806.

Jiang, Yeping et al., "Fermi-Level Tuning of Epitaxial Sb2Te3 Thin Films on Graphene by Regulating Intrinsic Defects and Substrate Transfer Doping", Physical Review Letters, 2012, 108:066809.

Kim et al., Realization of a high mobility dual-gated graphene field-effect transistor with Al2O3 dielectric, Appl. Phys. Lett. 2009, 94, 062107.

Kim et al., Vertically aligned ZnO nanostructures grown on graphene layers, Applied Physics Letters, 2009, 95, 213101-1 through 213101-3.

(56) References Cited

OTHER PUBLICATIONS

Kind H. et al. Nanowire Ultraviolet Photodetectors and Optical Switches, Advanced Materials, 2002, 14(2), 158-160.
Kneissl, Advances in group III-nitride-based deep UV light-emitting diode technology, Semiconductor Sci and Tech, 2011, 26, 014036.
Lee, Chul-Ho et al., "Flexible Inorganic Nanostructure Light-Emitting Diodes Fabricated on Graphene Films," Advanced Materials, 2011, 23, 4614-4619.
Mariani et al., Patterned radial GaAs nanopillar solar cells, Nano Letters, 2011, 11, 2490-2494.
Marzouki et al., Structural and optical characterizations of nitrogen doped ZnO nanowires grown by MOCVD, Materials Letters, 2010, 64, 2112-2114.
Mohseni et al., Hybrid GaAs-Nanowire Carbon-Nanotube Flexible Photovoltaics, IEEE Journal of Selected Topics in Quantum Electronics, 201, 17(4), 1070-1077.
Mulyana et al., Reversible Oxidation of Graphene Through Ultraviolet/Ozone Treatment and Its Nonthermal Reduction through Ultraviolet Irradiation, J Phys Chem C, 2014, 118(47), 27372-27381.
Mulyana et al., Thermal reversibility in electrical characteristics of ultraviolet/ozone treated graphene, Applied Physics Letters, 2013, 103, 063107.
Munshi et al., Position-Controlled Uniform GaAs Nanowires on Silicon using Nanoimprint Lithography, Nano Letters, 2014, 14, 960-966.
Munshi, et al., "Vertically aligned GaAs nanowires on graphite and few-layer graphene: Generic model epitaxial growth", Nano Letters 2012, 12(9): 4570-4573.
Musolino et al. Compatibility of the selective area growth of GaN nanowires on AlN buffered Si substrates with the operation of light emitting diodes. Nanotechnology 2015, 26,085605.
Nayak, B.B. et al., "Surface nitriding of graphite substrate by plasma focus device towards synthesis of carbon nitride coating", Surface and Coating Technology 145 (2001), pp. 8-15.
Nevidomskyy et al., Chemically active substitutional nitrogen impurity in carbon nanotubes, Phys Rev Lett, 91, 105502.
Nistor et al., The role of chemistry in graphene doping for carbon-based electronics, ACS Nano, 2011, 5(4), 3096-3103.
Paek et al., MBE-VLS growth of GaAs nanowires on (lll)Si substrate, Physica Status Solidi (C), 2008, 5(9), 2740-2742.
Park et al., Inorganic nanostructures grown on graphene layers, Nanoscale, 2011, 3(9), 3522-3533.
Park, et al., "Hybrid Semiconductor Nanostructures with Graphene Layers", 2012, Chapter 6.
Park, Jun Beom et al., "Metal catalyst-assisted growth of GaN nanowires on graphene films for flexible photocatalyst applications", Current Applied Physics, 2014, 14, 1437-1442.
Patsha et al., Growth of GaN nanostructures on graphene, Nanoscience, 2011 International Conference on Engineering and Technology (ICONSET), pp. 553-555.
Pela et al. "Accurate band gaps of AlGaN, InGaN, and AlInN alloys calculations based on LDA-1/2 approach." Appl Phys Lett, 2011, 98, 151907.
Peng et al., Control of growth orientation of GaN nanowires, Chemical Physics Letters, 2002,359, 241-245.
Pierret et al., Generic nano-imprint process for fabrication of nanowire arrays, Nanotechnology, 21(6), 065305.
Plissard et al., Gold-free growth of GaAs nanowires on silicon: arrays and polytypism, Nanotechnology, 2010, 21, 1-8.
Plissard et al., High yield of self-catalyzed GaAs nanowire arrays grown on silicon via gallium droplet positioning, Nanotechnology, 2011, 22, 275602.
Sun et al., Compounds Semiconductor Nanowire Solar Cells, IEEE Journal of Selected Topics in Quantum Electronics, 2011, 17(4), 1033-1049.
Tateno, K. et al., "VLS Growth of III-V Semiconductor Nanowires on Graphene Layers," MRS Online Proceedings, 2012, 1439, 45-50, XP002732679.
Toko et al. Selective formation of large-grained (100)- or (111)-oriented Si on glass by Al-induced layer exchange. JAppl Phys, 2014, 115,094301.
Tomioka et al., Control of InAs Nanowire Growth Directions on Si, Nano Letters, 2008, 8(10), 3475-3480.
Virojanadara, et al., "Large homogeneous mono-/bilayer graphene on 6H—SiC (0001) and buffer layer elimination", J Phys D: Appl Phys. 2010, 43, 374010.
Wang et al., Growth of Nanowires, Materials Science and Engineering, 2008, 60, 1-51.
Wang et al., Nanocrystal growth on graphene in various degrees of oxidation, Journal of American Chemical Society, 2010, 132, 3270-3271.
Yamaguchi et al., Passivating chemical vapor deposited graphene with metal oxides for transfer and transistor fabrication processes, Appl Phys Lett, 2013, 102, 143505.
Yin et al., Application of CVD graphene as transparent front electrode in Cu(ln,GA)Se2 solar cell, 2014 IEEE 40th Photovoltaic Specialist Conference (PVSC), pp. 1740-1744, XP032660257.
Yoo, et al., "Microstructural defects in GaN thin films grown on chemically vapor-deposited graphene layers", Applied Physics Letters 2013, 102 (5): 051908-1-051908-3.
Yoon et al., Vertical epitaxial Co5Ge7 nanowires and nanobelt arrays on a thin graphitic layer for flexible Field Emission Displays, Advanced Materials, 2009, 21, 4979-4982.
Yu et al., Electronic properties of nitrogen-atom-adsorbed graphene nanoribbons with armchair edges, IEEE transactions on Nanotechnology, 2010, 9(2), 243.
Zhao et al., Aluminum nitride nanowire light emitting diodes: Breaking the fundamental bottleneck of deep ultraviolet light sources, Scientific Reports, 2015, 5, 8332.
International Search Report and Written Opinion in PCT/EP2020/070228, Mailed Oct. 5, 2020. 18 pages.
Search report mailed Oct. 23, 2019 in related GB Application 1910170.8 (4 pages).

* cited by examiner (a) Top-view SEM image of n-AlGaN nanopyramids and (b) top-view SEM image of n-AlGaN/n-AlGaN/i-GaN/p-AlGaN heterostructured nanopyramid light-emitting diode (LED) structure grown on sapphire substrate using graphene as a hole mask.

(a) Current-voltage (I-V) curve of a processed AlGaN nanopyramid LED with device size 50 μm × 50 μm. (b) Electroluminescence (EL) spectrum of the same LED showing emission at 360 nm.

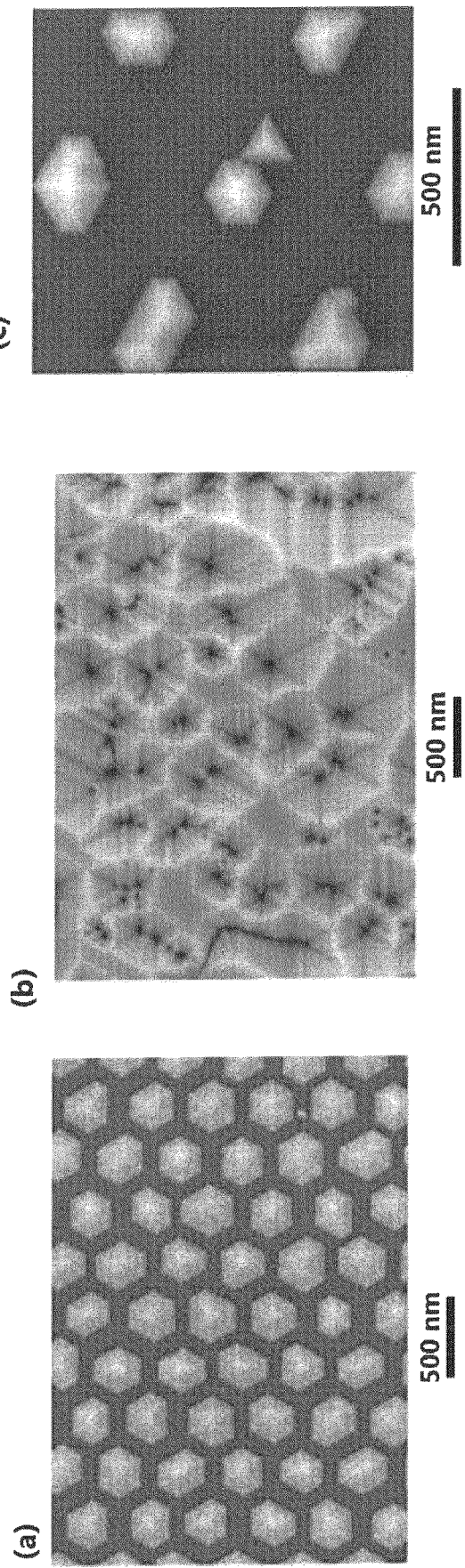

(a) Top-view SEM image of n-GaN nanopyramids and (b) top-view SEM image of n-GaN/n-AlGaN/i-GaN/p-AlGaN heterostructured nanopyramid LED structure grown on AlN/sapphire substrate using graphene as mask. (c) Top-view SEM image of seven positioned n-GaN nanopyramids showing one n-GaN triangular-based nanopyramid nucleated on the graphene mask by remote epitaxy.

Figure 15a-c (d) Current-voltage (I–V) curve of a processed flip-chip AlGaN nanopyramid LED with device size 50 μm × 50 μm.

COMPOSITION OF MATTER

CROSS REFERENCE TO RELATED APPLICATIONS

This application is a United States National Phase Patent Application of International Patent Application Number PCT/EP2020/076631, filed on Sep. 23, 2020, which claims the benefit of priority to GB Application No. 1913701.7, filed Sep. 23, 2019, and PCT/EP2020/070228 filed Jul. 16, 2020, all of which are incorporated by reference herein in their entireties.

This invention concerns the use of a thin polycrystalline or single-crystalline graphene layer as a buffer between a crystalline substrate and nanowires or nanopyramids which are grown epitaxially on the graphene layer. The epitaxial growth is however, dictated by the crystal orientation of the crystalline substrate in a process called remote epitaxy. This results in an array of nanowires or nanopyramids with parallel facets, i.e. nanowires or nanopyramids with crystal orientation and facet orientations dictated by the crystalline substrate.

The resulting composition of matter, optionally separated from the substrate, can be formed into an LED or photodetector, e.g. for the emission or detection of light in the visible or UV spectrum, in particular UV LEDs and UV photodetectors. The nanowires or nanopyramids are preferably provided with a conductive and ideally reflective top contact electrode material to enable a flip chip arrangement.

In another aspect of the invention, compositions or devices which feature graphene as a hole mask layer are disclosed. Whilst the nanowires/nanopyramids are grown through the holes of the graphene layer, and thus are in direct epitaxial relationship with the underlying substrate, remote epitaxy can occur for any structures (e.g. nanoislands) grown on the graphene layer (i.e. outside of the holes).

BACKGROUND

Over recent years, interest in semiconductor nanocrystals (such as nanowires and nanopyramids) has intensified as nanotechnology becomes an important engineering discipline. Nanowires, which are also referred to as nanowhiskers, nanorods, nanopillars, nanocolumns, etc. by some authors, have found important applications in a variety of electrical devices such as sensors, solar cells, and light emitting diodes (LEDs).

The present invention concerns LEDs and photodetectors which emit or detect light, such as visible light, preferably emit and detect light in the ultra violet (UV) spectrum, respectively. The UV light can be classified into three separate wavelength types: UV-A: 315 to 400 nm, UV-B: 280 to 315, and UV-C: 100 to 280 nm.

The present invention relates to UV LEDs based on nanowires or nanopyramids as opposed to films of semiconducting material. The present inventors ideally seek UV LEDs preferably based on AlGaN, AlN or AlInGaN nanowires or nanopyramids. AlGaN or AlInGaN nanowires or nanopyramids based materials are the most suitable materials for the realization of LEDs covering the entire UV-A, UV-B, and UV-C bands.

The present inventors propose a solution involving the growth of nanowires (NWs) or nanopyramids (NPs) on a particular crystalline substrate covered with a thin graphene layer. In particular, the inventors consider growing AlN/AlGaN/AlInGaN NWs or NPs on a graphene layer. Graphene acts as a transparent and conductive contact to the NWs or NPs. Due to the transparency of graphene across all UV wavelengths and in particular in the UV-C wavelength region, graphene can be used as a bottom contact for NW or NP based UV LED devices.

The growth of nanowires on graphene is not new. In WO2012/080252, there is a discussion of the growth of semiconductor nanowires on graphene substrates using molecular beam epitaxy (MBE). WO2013/104723 concerns improvements on the '252 disclosure in which a graphene top contact is employed on NWs grown on graphene. These previous documents are not, however, concerned with UV LED flip chips. More recently, core shell nanowires grown on graphene have been disclosed (WO2013/190128).

The use of nanowires grown on graphene for LEDs, such as UV LEDs is however known from WO2017/009394. In all these disclosures however the growth of the nanowires is governed by lattice matching between the graphene layer and the NWs or NPs and not lattice matching with the underlying substrate.

It has been surprisingly found that when a very thin layer of graphene is used, the nanowires/nanopyramids can be grown epitaxially, with the crystal orientation of the nanowires/nanopyramids matching the underlying substrate rather than the graphene layer. Despite therefore, the graphene layer acting as a buffer between the substrate and the nanowires or nanopyramids, they still grow with a crystal direction/facet direction that reflects the substrate rather than the graphene. We call this remote epitaxy. The resulting nanowire array is more regular with parallel facets. This improves the electronic properties of the material.

Moreover, remote epitaxy allows substrates to be chosen that offer a very close lattice match to the nanowires or nanopyramids. The substrate could even be the same material as the nanowires or nanopyramids. The nanowires or nanopyramids can then be grown without defects and in a preferred orientation.

Epitaxy—the growth of a crystalline material on a substrate—is crucial for the semiconductor industry, but is often limited by the need for lattice matching between the two material systems. We have found that the weak van der Waals potential of a thin layer of graphene does not completely screen the stronger potential field of the substrate, which enables epitaxial growth to occur despite the presence of the graphene layer.

The lattice constants of group III-V semiconductors typically do not match the lattice constants of usual substrates. As understood in the art, lattice constant mismatch between a substrate and an epitaxial nanowire can introduce strain into the epitaxial nanowire, thereby preventing epitaxial growth without defects. Non-silicon substrates are usually employed as seeds for epitaxial growth of most functional semiconductors. However, non-Si substrates with lattice constants matching those of functional materials can be costly and therefore limit the development of non-Si electronic/photonic devices.

One method to address the high cost of non-silicon substrates is the "layer-transfer" technique, in which functional device layers are grown on lattice-matched substrates and then removed and transferred to other substrates. The remaining lattice-matched substrates can then be reused to fabricate another device layer, thereby reducing the cost. WO2017/0044577 improves upon convention layer transfer techniques using a graphene based intermediate layer between a lattice matched substrate and semiconductor top layer. In this document however, the top film is then separated from the graphene layer.

The present inventors have appreciated that a preferred device design involves a flip-chip design where the graphene layer can be used as the emitting side of the LED, as that improves light extraction efficiency.

It is also remarkable that the graphene layer (carrying the nanowires/nanopyramids) can be peeled from the substrate so that the graphene+nanowires/nanopyramids structure can be separated from the substrate. This is important as the substrate can be an expensive material or can be opaque to light. If peeled from the graphene layer, the substrate can be reused to grow more graphene supported nanowires/nanopyramids. Moreover, if the substrate is removed, the lack of transparency that could be caused by the presence of the substrate is avoided. The claimed solution therefore solves multiple problems. We provide an ideal route to valuable defect free nanowires or nanopyramids as these can be lattice matched to the growth substrate. We achieve that in a process in which the potentially expensive crystalline substrate can be reused. We use the graphene layer as a conducting layer connecting the nanowire in a device.

In Nature, Vol 544, 30 Apr. 2017, the possibility of growing a thin film on a GaAs substrate with graphene buffer layer is described.

In Appl. Phys. Lett. 113, 233103 (2018) discloses remote heteroepitaxy of ZnO microrods on a GaN substrate across graphene layers via hydrothermal growth.

No one before, however, has considered growing group III-V nanowires or nanopyramids on a graphene buffer layer with substrate beneath which directs epitaxial growth of the nanowires or nanopyramids. Moreover, in the Nature article, the suggestion is made that the thin film grown can be separated from the substrate and graphene layer. In essence therefore, the graphene layer acts to prevent direct bonding between substrate and thin film. No one before has appreciated that the graphene layer can act as an electrode and can be separated from the substrate.

The present inventors have also realised that remote epitaxial effects can be beneficial even if the nanowires/nanopyramids are grown through holes in the graphene layer. In a particular embodiment of the invention, the compositions or devices use graphene as a hole mask layer. The NWs/NPs grow in the holes of the graphene layer directly from the substrate, and any additional nanostructures that have grown on top of the graphene directly, i.e. not in the holes, can also be epitaxial with the substrate beneath the graphene (or with an intermediate layer between the substrate and graphene layer) through remote epitaxy. This can lead to structural and optical/electrical benefits, especially when the NWs/NPs are grown to coalesce.

SUMMARY OF INVENTION

Thus, viewed from one aspect, the invention provides a composition of matter comprising:

a plurality of group III-V nanowires or nanopyramids epitaxially grown on a polycrystalline or single-crystalline graphene layer, said graphene layer being directly supported on a crystalline substrate such as a group III-V semiconductor, sapphire, SiC or diamond substrate, wherein the epitaxy, crystal orientation and facet orientations of said nanowires or nanopyramids are directed by the crystalline substrate.

The invention also relates to a process for the preparation of a composition of matter which can be used in the LED and photodectors described below. Viewed from this aspect, the invention provides a process comprising:

(i) epitaxially growing group III-V nanowires or nanopyramids on a polycrystalline or single-crystalline graphene layer which is directly supported on a crystalline substrate such as a group III-V semiconductor, sapphire, SiC or sapphire substrate wherein the epitaxy, crystal orientation and facet orientations of said nanowires or nanopyramids are directed by the crystalline substrate; and (ii) optionally separating the substrate from the graphene layer with the grown III-V nanowires or nanopyramids.

The resulting graphene layer/nanowires/nanopyramids structure, with or without substrate, may be used in the LED and photodetector embodiments below. It is in fact a key feature of the present invention that the group III-V semiconductor nanowires or nanopyramids which are grown epitaxially on a graphene layer have a crystal orientation and facet orientations dictated by the crystalline substrate on which the nanowires or nanopyramids were grown.

Viewed from another aspect, the invention provides a process comprising:

(i) epitaxially growing group III-V nanowires or nanopyramids on a polycrystalline or single-crystalline graphene layer which is directly supported on a crystalline substrate such as a group III-V semiconductor, sapphire, SiC or sapphire substrate wherein the epitaxy, crystal orientation and facet orientations of said nanowires or nanopyramids are directed by the crystalline substrate wherein said nanowires or nanopyramids have a p-n or p-i-n junction; and (ii) optionally separating the substrate from the graphene layer.

Viewed from another aspect, the invention provides a process comprising epitaxially growing group III-V nanowires or nanopyramids through holes on a hole patterned mask carried on a polycrystalline or single-crystalline graphene layer which is directly supported on a crystalline substrate such as a group III-V semiconductor, sapphire, SiC or sapphire substrate wherein the epitaxy, crystal orientation and facet orientations of said nanowires or nanopyramids are directed by the crystalline substrate and wherein said nanowires or nanopyramids have a p-n or p-i-n junction; and (ii) optionally separating the substrate from the graphene layer.

Viewed from another aspect, the invention provides a light-emitting diode device comprising:

epitaxially growing group III-V nanowires or nanopyramids through holes on a hole patterned mask carried on a polycrystalline or single-crystalline graphene layer which is directly supported on a crystalline substrate such as a group III-V semiconductor, sapphire, SiC or sapphire substrate wherein the epitaxy, crystal orientation and facet orientations of said nanowires or nanopyramids are directed by the crystalline substrate and wherein said nanowires or nanopyramids have a p-n or p-i-n junction;

a first electrode in electrical contact with said graphene layer;

a second electrode in contact with the top of at least a portion of said nanowires or nanopyramids, optionally in the form of a light-reflective layer;

and wherein in use light is emitted from said device in a direction substantially opposite to said light-reflective layer.

Viewed from another aspect, the invention provides a light-emitting diode device comprising:

a plurality of group III-V nanowires or nanopyramids epitaxially grown on a polycrystalline or single-crystalline graphene layer, said graphene layer being directly supported on a crystalline substrate such as a group III-V semiconductor, sapphire, SiC or diamond substrate, wherein the epitaxy, crystal orientation and facet orientations of said nanowires or nanopyramids are directed by the crystalline substrate, said nanowires or nanopyramids having a p-n or p-i-n junction;

a light-reflective layer in contact with the top of at least a portion of said nanowires or nanopyramids, said light-reflective layer optionally acting as the second electrode;

a second electrode in electrical contact with the top of at least a portion of said nanowires or nanopyramids, said second electrode being essential where said light-reflective layer does not act as an electrode;

wherein said nanowires or nanopyramids comprise at least one group III-V compound semiconductor; and wherein in use light is emitted from said device in a direction substantially opposite to said light-reflective layer.

In a second embodiment, the invention relates to a photodetector. Rather than emitting light, the device of the invention can be adapted to absorb light and subsequently generate a photocurrent and hence detect light.

Thus, viewed from another aspect the invention provides a photodetector device comprising:

a plurality of group III-V nanowires or nanopyramids epitaxially grown on a polycrystalline or single-crystalline graphene layer, said graphene layer being directly supported on a crystalline substrate such as a group III-V semiconductor, sapphire, SiC or diamond substrate, wherein the epitaxy, crystal orientation and facet orientations of said nanowires or nanopyramids are directed by the crystalline substrate, said nanowires or nanopyramids having a p-n or p-i-n junction;

a first electrode in electrical contact with said graphene layer;

a second electrode in contact with the top of at least a portion of said nanowires or nanopyramids, optionally in the form of a light-reflective layer;

wherein said nanowires or nanopyramids comprise at least one group III-V compound semiconductor; and wherein in use light is absorbed in said device.

In other aspects of the invention, a graphene hole mask is used and the nanowires/nanopyramids are grown directly on the substrate (or on an intermediate layer positioned between the substrate and the graphene layer) through the holes in the graphene. Thus, in another aspect the invention provides a composition of matter comprising:

a sapphire, Si, SiC, $Ga_2O_3$ or group III-V semiconductor substrate;

an intermediate group III-V semiconductor layer directly on top of said substrate;

a graphene layer directly on top of said intermediate layer;

wherein a plurality of holes are present through said graphene layer; and wherein a plurality of nanowires or nanopyramids are grown from said intermediate layer in said holes, said nanowires or nanopyramids comprising at least one semiconducting group III-V compound.

In another aspect, the invention provides a composition of matter comprising:

a graphene layer carried directly on a sapphire, Si, SiC, $Ga_2O_3$ or group III-V semiconductor substrate;

wherein a plurality of holes are present through said graphene layer; and wherein a plurality of nanowires or nanopyramids are grown from said substrate in said holes, said nanowires or nanopyramids comprising at least one semiconducting group III-V compound.

In another aspect the invention provides a process comprising:

(I) obtaining a composition of matter in which a graphene layer is carried directly on a group III-V intermediate layer, wherein said intermediate layer is carried directly on a sapphire, Si, SiC, $Ga_2O_3$ or group III-V semiconductor substrate;

(II) etching a plurality of holes through said graphene layer; and (III) growing a plurality of nanowires or nanopyramids from said intermediate layer in said holes, said nanowires or nanopyramids comprising at least one semiconducting group III-V compound.

In another aspect the invention provides a process comprising:

(I) obtaining a composition of matter in which a graphene layer is carried directly on a sapphire, Si, SiC, $Ga_2O_3$ or group III-V semiconductor substrate;

(II) etching a plurality of holes through said graphene layer; and (III) growing a plurality of nanowires or nanopyramids from said substrate in said holes, said nanowires or nanopyramids comprising at least one semiconducting group III-V compound.

In another aspect, the invention provides a product obtained by any process as defined above or below. In another aspect the invention provides a device, such as an opto-electronic device, comprising a composition as defined above or below, e.g. a solar cell, photodetector or LED.

Definitions

By a group III-V compound semiconductor is meant one comprising at least one element from group III and at least one element from group V. There may be more than one element present from each group, e.g. AlGaN (i.e. a ternary compound), AlInGaN (i.e. a quaternary compound), and so on. The designation Al(In)GaN implies either AlGaN or AlInGaN, i.e. that the presence of In is optional. Any element indicated in brackets may or may not be present.

The term nanowire is used herein to describe a solid, wire-like structure of nanometer dimensions. Nanowires preferably have an even diameter throughout the majority of the nanowire, e.g. at least 75% of its length. The term nanowire is intended to cover the use of nanorods, nanopillars, nanocolumns or nanowhiskers some of which may have tapered end structures. The nanowires can be said to be in essentially in one-dimensional form with nanometer dimensions in their width or diameter and their length typically in the range of a few 100 nm to a few μm. Ideally the nanowire diameter is between 50 and 500 nm, however, the diameter can exceed few microns (called microwires).

Ideally, the diameter at the base of the nanowire and at the top of the nanowire should remain about the same (e.g. within 20% of each other).

The term nanopyramid refers to a solid pyramidal type structure. The term pyramidal is used herein to define a structure with a base whose sides taper to a single point generally above the centre of the base. It will be appreciated that the single vertex point may appear chamfered, e.g. such that the pyramid has a flat top Typically, the chamfered portion is equivalent to less than 50%, e.g. less than 40%, e.g. less than 30%, e.g. less than 20%, e.g. less than 10%, e.g. less than 5% of the total length of the nanopyramid edge. The nanopyramids may have multiple faces, such as 3 to 8 faces, or 4 to 7 faces. Thus, the base of the nanopyramids might be a square, pentagonal, hexagonal, heptagonal, octagonal and so on. The pyramid is formed as the faces taper from the base to a central point (forming therefore triangular faces). The triangular faces are normally terminated with (1-101) or (1-102) planes. The triangular side surfaces with (1-101) facets could either converge to a single point at the tip or could form new facets ((1-102) planes) before converging at the tip. In some cases, the nanopyramids are truncated with its top terminated with {0001} planes. The base itself may comprise a portion of even cross-section before tapering to form a pyramidal structure begins. The thickness of the base may therefore be up to 500 nm, e.g. up to 200 nm, such as 50 nm.

The base of the nanopyramids can be 50 to 500 nm in diameter across its widest point. In another embodiment, the base of the nanopyramids can be 200 nm to one micrometer in diameter across its widest point. The height of the nanopyramids may be 200 nm to a few microns, such as 400 nm to 1 micron in length.

It will be appreciated that the graphene layer carries a plurality of nanowires or nanopyramids. This may be called an array of nanowires or nanopyramids.

The term graphene refers to a planar sheet of $sp^2$-bonded carbon atoms in a honeycomb crystal structure. The term graphene layer refers to a layer comprising one or a plurality of planar sheets of $sp^2$-bonded carbon atoms in a honeycomb crystal structure. In typical embodiments, therefore the graphene layer is planar, i.e. flat. Whilst it is normal to use graphene it is also possible to use a derivative of graphene. Derivatives of graphene are those with surface modification. For example, the hydrogen atoms can be attached to the graphene surface to form graphane. Graphene with oxygen atoms attached to the surface along with carbon and hydrogen atoms is called as graphene oxide. The surface modification can also be affected by chemical doping or oxygen/hydrogen or nitrogen plasma treatment.

The term epitaxy comes from the Greek roots epi, meaning "above", and taxis, meaning "in ordered manner". The atomic arrangement of the nanowire or nanopyramid is based on the crystallographic structure of the substrate. Epitaxial growth means herein that the growth on the thin graphene layer of a nanowire or nanopyramid mimics the orientation of the substrate. This is called remote epitaxy. The orientation of the nanowire or nanopyramid is therefore in general different from a nanowire or nanopyramid that has an orientation that mimics the graphene layer. Typically, therefore, the nanowires/nanopyramids are not lattice-matched with the graphene.

The nanowires/nanopyramids grow such that the crystal orientation and facet orientations of said nanowires or nanopyramids are directed by the crystalline substrate. Thus the crystal orientation and facet orientations are the same for all nanowires/nanopyramids.

When remote epitaxy occurs, the growing nanowires/nanopyramids adopt their crystal (and thus facet) orientation from the crystalline substrate underneath the graphene layer. The nanowires/nanopyramids can be considered therefore to have parallel facets (see FIG. 7a). In contrast, where nanowires grow epitaxially from polycrystalline graphene, then the resulting nanowire facets are randomly oriented in different domains/grains, i.e., whereas the sides (facets) of hexagonal nanowires can be parallel within one graphene domain/grain, they are not parallel to but are at random orientation relative the sides (facets) of hexagonal nanowires within neighboring graphene domains/grains (see FIG. 7b). Nanowires can be hexagonal or square in cross section, preferably hexagonal. Remote epitaxy occurs where all crystal and facet orientations are the same.

The use of remote epitaxy can lead to improved electrical/optical properties in the final device. A regular array of nanowires/nanopyramids leads to these improvements.

Thus, for a plurality of nanowires/nanopyramids, the orientation of these nanowires/nanopyramids is regular.

Selective area growth (SAG) is a promising method for growing positioned nanowires or nanopyramids. This method is different from the self-assembled method, in which metal catalyst act as nucleation sites for the growth of nanowires or nanopyramids via vapour-liquid-solid (VLS) method. Another self-assembled method is the catalyst-free method to grow nanowires or nanopyramids, where nanowires or nanopyramids are nucleated in random positions. The self-assembled methods yield huge fluctuations in the length and diameter of the nanowires or nanopyramids.

The SAG method typically requires a mask with nanohole patterns on the substrate.

Thus in one embodiment the graphene layer carries a mask in which holes are patterned. The nanowires or nanopyramids nucleate in the holes of the patterned mask on the graphene layer. This yields uniform size and pre-defined position of the nanowires or nanopyramids.

The term mask refers to the mask material that is directly deposited on the graphene layer. The mask material should ideally not absorb emitted light (which could be visible, UV-A, UV-B or UV-C) in the case of an LED or not absorb the entering light of interest in the case of a photodetector. Preferably, the mask should also be electrically non-conductive. The mask could contain one or more than one material, which include $Al_2O_3$, $SiO_2$, $Si_3N_4$, $TiO_2$, $W_2O_3$, and so on. A silica mask is especially preferred. Subsequently, the hole patterns in the mask material can be prepared using electron beam lithography or nanoimprint lithography and dry or wet etching. The use of a mask also helps give strength to the graphene/NWs/NPs ensemble during detachment from the substrate.

MBE is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure as described in detail below. Over time, the incoming atoms form a nanowire or nanopyramid.

Metal organic vapour phase epitaxy (MOVPE) also called as metal organic chemical vapour deposition (MOCVD) is an alternative method to MBE for forming depositions on crystalline substrates. In case of MOVPE, the deposition material is supplied in the form of metal organic precursors, which on reaching the high temperature substrate decompose leaving atoms on the substrate surface. In addition, this method requires a carrier gas (typically $H_2$ and/or $N_2$) to transport deposition materials (atoms/molecules) across the substrate surface. These atoms reacting with other atoms form an epitaxial layer on the graphene surface. Choosing the deposition parameters carefully results in the formation of a nanowire or nanopyramid.

The term SPSL refers to a short period superlattice.

It will be appreciated that nanowires or nanopyramids will preferably have a p-n or p-i-n junction. The orientation of the junction does not matter (i.e. the junction can be n-i-p or n-p or p-i-n or p-n). In most cases, it is preferred to grow n-type layer first followed by i, if used, and p-type layers.

DETAILED DESCRIPTION OF INVENTION

This invention concerns a composition of matter which can be used in the manufacture of an LED in a flip chip arrangement or a photodetector in a flip chip arrangement. Whilst the invention is primarily described with reference to an LED, the reader will appreciate that essentially the same device can be used as a photodetector. Also, whilst the invention preferably concerns the emission and detection of UV light, the device is also applicable in other regions of the electromagnetic spectrum, in particular the visible region.

A device according to the invention comprises a nanostructured LED with a plurality of nanowires or nanopyramids grown on a polycrystalline or single-crystalline graphene layer where the epitaxy and crystal orientation and facet orientations of the nanowire or nanopyramid is directed by the crystalline substrate on which the graphene layer was supported during the growth process. Each nanowire or nanopyramid protrudes from a graphene layer and these ideally comprise a p-n or p-i-n junction. The invention preferably relates to devices in which the intention is that all the nanowires or nanopyramids contain the necessary junction but encompasses devices in which a few nanowires or nanopyramids might be free of such a junction. Ideally all nanowires or nanopyramids contain the necessary junction.

A top portion of each nanowire or nanopyramid may be provided with a light-reflective layer. This may simply touch the top of the nanowires or nanopyramids or encompass a top part of the nanowires or nanopyramids. The light-reflective layer may also act as a top contact electrode for the device or alternatively a separate top electrode may be provided. If an electrode is provided, a light-reflective layer may be in electrical contact with this electrode which is in electrical contact with the top of at least a portion of said nanowires or nanopyramids. It is thus important that there is an electrode that is in good electrical contact with both the top of the nanowires or nanopyramids top and the external circuit. When a light reflective layer is present, the light is preferably emitted from the device in a direction substantially parallel to but opposite from the growth direction of the nanowires, or absorbed into the device in a direction substantially parallel to and in the same direction as the growth direction of the nanowires. Typically, therefore, the light is emitted out of, or absorbed into, the part of the device where the bottoms of the nanowires are. In a particular embodiment, at least 50%, e.g. at least 60%, e.g. at least 70%, e.g. at least 80%, e.g. at least 90%, e.g. at least 95%, e.g. at least 99% of light is emitted from the device or absorbed into the device in the directions.

An electrode is also provided in electrical contact with the bottom portion of each nanowire or nanopyramid through the graphene layer. Hence there is a circuit via the top electrode which is in electrical contact with the other electrode via the p-n or p-i-n-junction in the nanowires or nanopyramids.

When a forward voltage is applied between the electrodes, light, preferably UV light is generated in the active region in the nanowire or nanopyramid, the device works as a LED.

When a reverse voltage is applied between the electrodes and is exposed to light, preferably UV light, the active region in the nanowire or nanopyramid absorbs the light and converts it into photocurrent, the device works as a photodetector.

Having a nanowire or nanopyramid grown epitaxially directed by the substrate provides homogeneity to the formed material which may enhance various end properties, e.g. mechanical, optical or electrical properties. Epitaxial nanowires or nanopyramids may be grown from solid, gaseous or liquid precursors. Because the epitaxy is governed by the crystalline substrate, the grown nanowire or nanopyramid can take on a crystal orientation and facet orientations directed by the substrate.

Graphene Layer

The graphene layer may comprise graphene or/and a graphene derivative. The graphene layer is polycrystalline or single-crystalline. The discussion on the graphene layer below applies to both the case where a graphene 'buffer' layer is used (i.e. without holes such that the NWs/NPs grow directly on the graphene), or to graphene as a hole pattern mask (i.e. with holes through which the NWs/NPs grow). The graphene layer should preferably be no more than 5 nm in thickness, especially no more than 3.0 nm, most especially no more than 15 Angstroms in thickness. Preferred thickness ranges include 0.3-10 nm, preferably 1-5 nm, 1-3 nm or 1-2 nm, more preferably 0.3-5 nm, 0.3-3 nm or 0.3-2 nm. Ideally, it should contain no more than 10 layers of graphene or its derivatives, preferably no more than 5 layers, preferably no more than 4 layers of graphene, preferably no more than 3 layers of graphene, preferably 1-5 layers of graphene, preferably 1-4 layers of graphene, e.g. 2-4 layers or 1-2 layers of graphene. Most preferably it has a thickness of 3 layers or less (which is called as a few-layered graphene). Especially preferably, it is a one-atom-thick planar sheet of graphene. Having a thin graphene layer is not only important for optical/electronic properties, but also for remote epitaxial effects. Typically, the best results for remote epitaxy are obtained when no more than 3-4 graphene layers are used (equivalent to about 1-2 nm).

Typically, the graphene layer is planar or flat. Typically, therefore, the graphene layer is a flat two-dimensional sheet. The distance between the base of the nanowires/nanopyramids and the top of the crystalline substrate is therefore typically equivalent to the thickness of the graphene layer. The distance between the base of the nanowires/nanopyramids and the top of the crystalline substrate is therefore preferably no more than 5 nm, especially no more than 3.0 nm, most especially no more than 15 Angstroms. Preferred ranges include 0.3-10 nm, preferably 1-5 nm, 1-3 nm or 1-2 nm, more preferably 0.3-5 nm, 0.3-3 nm or 0.3-2 nm.

The area of the graphene layer is not limited. This might be as much as 0.5 $mm^2$ or more, e.g. up to 5 $mm^2$ or more such as up to 10 $cm^2$. The area of the graphene layer is thus only limited by practicalities.

The graphene layer can be deposited directly on the substrate by any convenient method. Graphene could also be grown by a sublimation method, or grown by a self-assembly method on the substrate. Graphene can even be grown by MBE or MOCVD directly on the substrate.

Alternatively, the graphene could be grown on a Ni film or Cu foil by using a chemical vapour deposition (CVD) method. These CVD-grown graphene layers can be chemically exfoliated from the metal foil such as a Ni or Cu film by etching or by an electrochemical delamination method. The graphene layers after exfoliation are then transferred and deposited to the substrate for nanowire or nanopyramid growth. During the exfoliation and transfer, e-beam resist or photoresist may be used to support the thin graphene layers.

Whilst it is preferred if the graphene layer is used without modification, the surface of the graphene layer can be modified. For example, it can be treated with plasma of hydrogen, oxygen, nitrogen, $NO_2$ or their combinations. Oxidation of the graphene layer might enhance nanowire or nanopyramid nucleation. It may also be preferable to pre-treat the graphene layer, for example, to ensure purity before nanowire or nanopyramid growth. Treatment with a strong acid such as HF or BOE is an option. Graphene layers might be washed with iso-propanol, acetone, or n-methyl-2-pyr-rolidone to eliminate surface impurities.

The cleaned graphene layer can be further modified by doping. A solution of $FeCl_3$, $AuCl_3$ or $GaCl_3$ could be used in a doping step.

The graphene layer has excellent optical, electrical, thermal and mechanical properties. It is very thin but very strong, light, flexible, and impermeable. Most importantly in the present invention they are highly electrically and thermally conducting, and transparent. Crucially therefore, by having a graphene layer present, we provide an electrical contact to the nanowires without affecting the ability of a LED/photodetector to emit or absorb light.

Substrate

The crystalline substrate is one that guides the epitaxial growth of the nanowires or nanopyramids via remote epitaxy. The substrate is preferably a crystalline group III-V semiconductor, sapphire, SiC, or diamond substrate. In the case of the graphene layer acting as a hole mask (see discussion below), the nanowires/nanopyramids grow epitaxially and directly on the crystalline substrate through the holes in the graphene layer; in this case, the crystalline substrate guides the epitaxial growth of other structures, e.g. nanoislands, that grow on the graphene layer outside of the holes.

The thickness of the substrate is not important but in one embodiment it may be transparent. The substrate can rest on a preferably transparent support. Such a support can be as thick as required to support the substrate. The term transparent is used here to mean that the substrate/support allows transmission of light, in particular UV light. In particular, it is preferred if the substrate/support is transparent to UV-B and UV-C light.

Suitable supports include silica.

Once the nanowires or nanopyramids are grown, the substrate might be removed (e.g. by peeling off the graphene layer). If the substrate is removed, that might allow the use of substrate in further growth preparations. Peeling off the substrate also leaves a transparent composition of matter that is ideal for use in a LED or photodetector.

The substrate is preferably a group III-V compound. Group III element options are B, Al, Ga, In, and Tl. Preferred options here are Ga, Al and In.

Group V options are N, P, As, Sb. All are preferred, especially N.

It is of course possible to use more than one element from group III and/or more than one element from group V. Preferred compounds for the substrate include AlAs, GaSb, GaP, GaN, AlN, AlGaN, AlGaInN, GaAs, InP, InN, InGaAs, InSb, InAs, or AlGaAs. Compounds based on Al, Ga and In in combination with N are most preferred. The use of GaN, AlGaN, AlInGaN or AlN is highly preferred.

In another preferred option, the substrate is GaAs, InP or GaP. Depending on the nature of the substrate, a separate support may be required.

Typically, the crystalline substrate is a uniform layer, i.e. it is not made up of several superimposed layers. In a particular embodiment, the substrate is not a Distributed Bragg Reflector, for example. In a particular embodiment, the substrate is thicker than the graphene layer. Example thicknesses for the crystalline substrate are 1 nm-2 mm, e.g. 1 nm-1 mm, e.g. 1 nm-500 µm, e.g. 10 nm-1000 nm, e.g. 50-500 nm. Other suitable ranges for the thickness of the crystalline substrate include 1 µm-5 mm, e.g. 100 µm-3 mm, e.g. 300 µm-1 mm. The substrate or wafer thickness can depend on the size of the wafer. It can, for example, range from 300 µm (e.g. for a 2-inch wafer) to 1 mm (e.g. for a 8-inch wafer).

Growth of Nanowires or Nanopyramids

In order to prepare nanowires or nanopyramids of commercial importance, it is preferred that these grow epitaxially with a crystal orientation and facet orientations governed by the substrate. It is also ideal if growth occurs perpendicular to the crystalline substrate and ideally therefore in the <0001> (for hexagonal crystal structure) direction or <111> (for cubic crystal structure) direction.

The present inventors have determined that epitaxial growth occurs despite the presence of the graphene layer. In the case of the graphene layer acting as a hole mask (see discussion below), the nanowires/nanopyramids grow epitaxially and directly on the crystalline substrate/intermediate layer through the holes in the graphene layer; in this case, the crystalline substrate also guides the epitaxial growth of other structures, e.g. nanoislands, that grow on the graphene layer outside of the holes. The discussion below also applies to this case also, where technically viable.

In a growing nanopyramid, the triangular faces are normally terminated with (1-101) or (1-102) planes. The triangular side surfaces with (1-101) facets could either converge to a single point at the tip or could form new facets ((1-102) planes) before converging at the tip. In some cases, the nanopyramids are truncated with its top terminated with {0001} planes.

Whilst it is ideal that there is no lattice mismatch between a growing nanowire or nanopyramid and the substrate, nanowires or nanopyramids can accommodate much more lattice mismatch than thin films. However, an advantage of the present invention is that there is a very close lattice match between the substrate and growing NWs or NPs. In the case of the graphene hole mask, in which the NWs/NPs grow directly on the substrate/intermediate layer, as the substrate or intermediate layer can be a group III-V semiconductor like the nanowires/nanopyramids, very low lattice mismatches are possible.

Growth of nanowires/nanopyramids can be controlled through flux ratios. Nanopyramids are encouraged, for example if high group V flux is employed.

The nanowires that are grown can be said to be in essentially in one-dimensional form with nanometer dimensions in their width or diameter and their length typically in the range of a few 100 nm to a few µm. Ideally the nanowire diameter is not greater than 500 nm. Ideally the nanowire diameter is between 50 and 500 nm; however, the diameter can exceed few micrometers (called microwires).

The nanowires grown in the present invention may therefore be from 250 nm to several microns in length, e.g. up to 5 microns. Preferably the nanowires are at least 1 micron in length. Where a plurality of nanowires are grown, it is preferred if they all meet these dimension requirements. Ideally, at least 90% of the nanowires grown on a graphene layer will be at least 1 micron in length. Preferably substantially all the nanowires will be at least 1 micron in length.

Nanopyramids may be 250 nm to 1 micron in height, such as 400 to 800 nm in height, such as about 500 nm.

Moreover, it will be preferred if the nanowires or nanopyramids grown have the same dimensions, e.g. to within 10% of each other. Thus, at least 90% (preferably substantially all) of the nanowires or nanopyramids on a graphene layer (or on a substrate/intermediate layer) will preferably be of the same diameter and/or the same length (i.e. to within 10% of the diameter/length of each other). Essentially, therefore the skilled man is looking for homogeneity and nanowires or nanopyramids that are substantially the same in terms of dimensions.

The length of the nanowires or nanopyramids is often controlled by the length of time for which the growing process runs. A longer process typically leads to a (much) longer nanowire or nanopyramid.

The nanowires have typically a hexagonal cross sectional shape. The nanowire may have a cross sectional diameter of 25 nm to several hundred nm (i.e. its thickness). Suitable nanowire diameters include 1-1000 nm, e.g. 5-800 nm, 10-500 nm, or 50-500 nm. In some embodiments, the nanowire can be a microwire and hence have a size up to 2 µm. It is however preferred if the nanowire has a cross sectional diameter of less than 1.0 µm. As noted above, the diameter is ideally constant throughout the majority of the nanowire, e.g. at least 75% of its length. Typically, there is a difference in diameter of less than 20%, e.g. less than 10%, e.g. less than 5%, along the length of the nanowires. Nanowire diameter can be controlled by the manipulation of the ratio of the atoms used to make the nanowire as described further below. Nanowire diameter can be controlled by the manipulation of the growth parameters such as the substrate temperature and/or the ratio of the atoms used to make the nanowire as described further below.

Indeed, the length and diameter of the nanowires or nanopyramids can be affected by the temperature at which they are formed. Higher temperatures encourage high aspect ratios (i.e. longer and/or thinner nanowires or nanopyramids). The diameter can also be controlled by manipulating the nanohole opening size of the mask layer. The skilled man is able to manipulate the growing process to design nanowires or nanopyramids of desired dimensions.

The hexagonal nanowires are preferably oriented such that their sides are parallel as opposed to randomly oriented. When nanowires grow epitaxially on polycrystalline graphene, the hexagonal nanowires tend to orientate randomly in different graphene domains/grains. Therefore, in the case of polycrystalline graphene, one way of determining whether the growth of nanowires is (remote) epitaxial based on the substrate is by determining whether the hexagonal nanowires have essentially parallel facets. If the hexagonal nanowires have parallel sides in different graphene domains, then such nanowires are epitaxially grown with an orientation that matches the substrate. If hexagonal nanowires are oriented randomly in different graphene domains/grains, then that is a feature of nanowires grown epitaxially on polycrystalline graphene. FIGS. 7a and 7b demonstrate the contrast between parallel faceted growth and growth in multiple domains/grains.

In case of single-crystalline graphene, by comparing the crystal orientation of the crystalline substrate, single-crystalline graphene, and the nanowires, one can determine if the epitaxy is dictated by graphene or by the crystalline substrate underneath. (See Nanotechnology 29 (2018) 445702. https://doi.org/10.1088/1361-6528/aadb78 and Adv. Funct. Mater. 2019, 1905056 https://doi.org/10.1002/adfm.201905056)

The nanowires or nanopyramids of the invention are formed from at least one III-V compound semiconductor. The group III-V compounds discussed herein for the nanowires or nanopyramids are also suitable for the group III-V semiconductor substrate. Preferably, the nanowires or nanopyramids consist of group III-V compounds most of which are doped as discussed below. Note that there may be more than one different group III-V compound present but it is preferred if all compounds present are group III-V compounds.

Group III element options are B, Al, Ga, In, and Tl. Preferred options here are Ga, Al and In.

Group V options are N, P, As, Sb. All are preferred, especially N.

It is of course possible to use more than one element from group III and/or more than one element from group V. Preferred compounds for nanowire or nanopyramid manufacture include AlAs, GaSb, GaP, GaN, AlN, AlGaN, AlGaInN, GaAs, InP, InN, InGaAs, InSb, InAs, or AlGaAs. Compounds based on Al, Ga and In in combination with N are most preferred. The use of GaN, AlGaN, AlInGaN or AlN is highly preferred.

It is most preferred if the nanowires or nanopyramids consist of Ga, Al, In and N (along with any doping atoms as discussed below).

Whilst the use of binary materials is possible, the use of ternary nanowires or nanopyramids in which there are two group III cations with a group V anion are preferred here, such as AlGaN. The ternary compounds may therefore be of formula XYZ wherein X is a group III element, Y is a group III element different from X, and Z is a group V element. The X to Y molar ratio in XYZ is preferably 0.1 to 0.9, i.e. the formula is preferably $X_xY_{1-x}Z$ where subscript x is 0.1 to 0.9.

Quaternary systems might also be used and may be represented by the formula $A_xB_{1-x}C_yD_{1-y}$ where A and B are different group III elements and C and D are group V elements or formula $A_xB_yC_{1-x-y}D$ where A, B and C are different group III elements and D is a group V element. Again subscripts x and y are typically 0.1 to 0.9. Other options will be clear to the skilled man.

The growth of AlGaN and AlInGaN nanowires or nanopyramids is especially preferred. The wavelength of light emitted by a device containing these nanowires or nanopyramids can be tailored by manipulating the content of Al, In and Ga. Alternatively, the pitch and/or diameter of the nanowires or nanopyramids can be varied to change the nature of the light emitted.

It is further preferred if the nanowires or nanopyramids contain regions of differing compounds. The nanowire or nanopyramid might therefore contain a region of a first group III-V semiconductor such as GaN followed by a region of a different III-V semi-conductor such as AlGaN. Nanowires or nanopyramids can contain multiple regions such as two or more or three or more. These regions might be layers in an axially grown nanowire or shells in a radially grown nanowire or nanopyramid.

In order to facilitate the separation of the graphene layer from the substrate, an inert filler may be used to surround the grown NWs or NPs.

Doping

The nanowires or nanopyramids of the invention may contain a p-n or p-i-n junction. Devices of the invention, especially those based on a p-i-n junction are therefore optionally provided with an undoped intrinsic semiconductor region between a p-type semiconductor and an n-type semiconductor region. Some of the p-type and n-type regions are typically heavily doped because they are used for ohmic contacts. The intrinsic region could be a single active layer or several active layers consisting of multiple quantum well and multiple quantum barriers.

It is therefore preferred that the nanowires or nanopyramids are doped. Doping typically involves the introduction of impurity ions into the nanowire or nanopyramid, e.g. during MBE or MOVPE growth. The doping level can be controlled from ~$10^{15}$/cm$^3$ to $10^{20}$/cm$^3$. The nanowires or nanopyramids can be p-type doped or n-type doped as desired. Doped semiconductors are extrinsic conductors.

The n(p)-type semiconductors have a larger electron (hole) concentration than hole (electron) concentration by doping an intrinsic semiconductor with donor (acceptor) impurities. Suitable donor (acceptors) for III-V compounds, especially nitrides, can be Si (Mg, Be and Zn). Dopants can be introduced during the growth process or by ion implantation of the nanowires or nanopyramids after their formation.

Higher carrier injection efficiency is required to obtain higher external quantum efficiency (EQE) of LEDs. However, the increasing ionization energy of Mg acceptors with increasing Al content in AlGaN alloys makes it difficult to obtain higher hole concentration in AlGaN alloys with higher Al content. To obtain higher hole injection efficiency (especially in the barrier layers consisting of high Al content), the inventors have devised a number of strategies which can be used individually or together.

There are problems to overcome in the doping process therefore. It is preferred if the nanowires or nanopyramids of the invention comprise Al. The use of Al is advantageous as high Al content leads to high band gaps, enabling UV-C LED emission from the active layer(s) of nanowires or nanopyramids and/or avoiding absorption of the emitted light in the doped barrier layers. Where the band gap is high, it is less likely that UV light is absorbed by this part of the nanowires or nanopyramids. The use therefore of AlN or AlGaN in nanowires or nanopyramids is preferred.

However, p-type doping of AlGaN or AlN to achieve high electrical conductivity (high hole concentration) is challenging as the ionization energy of Mg or Be acceptors increases with increasing Al content in AlGaN alloys. The present inventors propose various solutions to maximise electrical conductivity (i.e. maximise hole concentration) in AlGaN alloys with higher average Al content.

Where the nanowires or nanopyramids comprise AlN or AlGaN, achieving high electrical conductivity by introducing p-type dopants is a challenge. One solution relies on a short period superlattice (SPSL). In this method, we grow a superlattice structure consisting of alternating layers with different Al content instead of a homogeneous AlGaN layer with higher Al composition. For example, the barrier layer with 35% Al content could be replaced with a 1.8 to 2.0 nm thick SPSL consisting of, for example, alternating $Al_xGa_{1-x}N$:Mg/$Al_yGa_{1-y}N$:Mg with x=0.30/y=0.40. The low ionization energy of acceptors in layers with lower Al composition leads to improved hole injection efficiency without compromising on the barrier height in the barrier layer. This effect is additionally enhanced by the polarization fields at the interfaces. The SPSL can be followed with a highly p-doped GaN:Mg layer for better hole injection.

More generally, the inventors propose to introduce a p-type doped $Al_xGa_{1-x}N$/$Al_yGa_{1-y}N$ short period superlattice (i.e. alternating thin layers of $Al_xGa_{1-x}N$ and $Al_yGa_{1-y}N$) into the nanowires or nanopyramid structure, where the Al mole fraction x is less than y, instead of a p-type doped $Al_zGa_{1-z}N$ alloy where x<z<y. It is appreciated that x could be as low as 0 (i.e. GaN) and y could be as high as 1 (i.e. AlN). The superlattice period should preferably be 5 nm or less, such as 2 nm, in which case the superlattice will act as a single $Al_zGa_{1-z}N$ alloy (with z being a layer thickness weighted average of x and y) but with a higher electrical conductivity than that of the $Al_zGa_{1-z}N$ alloy, due to the higher p-type doping efficiency for the lower Al content $Al_xGa_{1-x}N$ layers.

In the nanowires or nanopyramids comprising a p-type doped superlattice, it is preferred if the p-type dopant is an alkali earth metal such as Mg or Be.

A further option to solve the problem of doping an Al containing nanowire/nanopyramid follows similar principles. Instead of a superlattice containing thin AlGaN layers with low or no Al content, a nanostructure can be designed containing a gradient of Al content (mole fraction) in the growth direction of the AlGaN within the nanowires or nanopyramids. Thus, as the nanowires or nanopyramids grow, the Al content is reduced/increased and then increased/reduced again to create an Al content gradient within the nanowires or nanopyramids.

This may be called polarization doping. In one method, the layers are graded either from GaN to AlN or AlN to GaN. The graded region from GaN to AlN and AlN to GaN may lead to n-type and p-type conduction, respectively. This can happen due to the presence of dipoles with different magnitude compared to its neighbouring dipoles. The GaN to AlN and AlN to GaN graded regions can be additionally doped with n-type dopant and p-type dopant respectively.

In a preferred embodiment, p-type doping is used in AlGaN nanowires using Be as a dopant.

Thus, one option would be to start with a GaN nanowire/nanopyramid and increase Al and decrease Ga content gradually to form AlN, perhaps over a growth thickness of 100 nm. This graded region could act as a p- or n-type region, depending on the crystal plane, polarity and whether the Al content is decreasing or increasing in the graded region, respectively. Then the opposite process is effected to produce GaN once more to create an n- or p-type region (opposite to that previously prepared). These graded regions could be additionally doped with n-type dopants such as Si and p-type dopants such as Mg or Be to obtain n- or p-type regions with high charge carrier density, respectively. The crystal planes and polarity is governed by the type of nanowire/nanopyramid as is known in the art.

Viewed from another aspect therefore, the nanowires or nanopyramids of the invention comprise Al, Ga and N atoms wherein during the growth of the nanowires or nanopyramids the concentration of Al is varied to create an Al concentration gradient within the nanowires or nanopyramids.

In a third embodiment, the problem of doping in an Al containing nanowire or nanopyramid is addressed using a tunnel junction. A tunnel junction is a barrier, such as a thin layer, between two electrically conducting materials. In the context of the present invention, the barrier functions as an ohmic electrical contact in the middle of a semiconductor device.

In one method, a thin electron blocking layer is inserted immediately after the active region, which is followed by a p-type doped AlGaN barrier layer with Al content higher than the Al content used in the active layers. The p-type doped barrier layer is followed by a highly p-type doped barrier layer and a very thin tunnel junction layer followed by an n-type doped AlGaN layer. The tunnel junction layer is chosen such that the electrons tunnel from the valence band in p-AlGaN to the conduction band in the n-AlGaN, creating holes that are injected into the p-AlGaN layer.

More generally, it is preferred if the nanowire or nanopyramid comprises two regions of doped GaN (one p- and one n-doped region) separated by an Al layer, such as a very thin Al layer. The Al layer might be a few nm thick such as 1 to 10 nm in thickness. It is appreciated that there are other optional materials that can serve as a tunnel junction which includes highly doped InGaN layers.

It is particularly surprising that doped GaN layers can be grown on the Al layer.

In one embodiment therefore, the invention provides a nanowire or nanopyramid having a p-type doped (Al)GaN region and an n-type doped (Al)GaN region separated by an Al layer.

The nanowires or nanopyramids of the invention can be grown to have a heterostructured form radially or axially. For example for an axial heterostructured nanowire or nanopyramid, p-n junction can be axially formed by growing a p-type doped core first, and then continue with an n-doped core (or vice versa). The core can also be axially heterostructured and the shell can be radially heterostructured. An intrinsic region can be positioned between doped cores for a p-i-n nanowire or nanopyramid. For a radially heterostructured nanowire or nanopyramid, p-n junction can be radially formed by growing the p-doped nanowire or nanopyramid core first, and then the n-doped semiconducting shell is grown (or vice versa). An intrinsic shell can be positioned between doped regions for a p-i-n nanowire or nanopyramid.

It is preferred if the nanowires are grown axially and are therefore formed from a first section and a second section axially up the nanowire or nanopyramid. The two sections are doped differently to generate a p-n junction or p-i-n junction. The top or bottom section of the nanowire is the p-doped or n-doped section.

In a p-i-n nanowire or nanopyramid, when charge carriers are injected into the respective p- and n-regions, they recombine in the i-region, and this recombination generates light. In a p-n junction case, recombination will occur in the space charge region (as there is no intrinsic region). The light is generated inside each nanowire or nanopyramid randomly and emitted in all directions. One problem with such a structure is that a substantial fraction of the generated light is wasted, as only a portion is directed in a desired direction. The use therefore of a reflective layer ensures that the emitted light is directed out from the device in a desired direction, in particular opposite to the reflective layer. In particular, light is reflected out through the graphene layer and substrate (if present) (these being opposite to the light reflective layer).

In the photodetector embodiment, the reflective layer is not essential but if present, may reflect back light on to the nanowires or nanopyramids for detection that would otherwise be lost.

The nanowires or nanopyramids of the invention preferably grow epitaxially. The crystal orientation is governed by the substrate. Accordingly, at the junction of the graphene layer and the base of the nanowire or nanopyramid, crystal planes are formed epitaxially within the nanowire or nanopyramid. These build-up, one upon another, in the same crystallographic direction thus allowing the epitaxial growth of the nanowire or nanopyramid. Preferably the nanowires or nanopyramids grow vertically. The term vertically here is used to imply that the nanowires or nanopyramids grow perpendicular to the graphene layer. It will be appreciated that in experimental science the growth angle may not be exactly 90° but the term vertically implies that the nanowires or nanopyramids are within about 10° of vertical/perpendicular, e.g. within 5°. Because of the epitaxial growth, it is expected that there will be an intimate contact between the nanowires or nanopyramids and the graphene layer. To enhance the contact property further, the graphene layer can be doped to match the major carriers of grown nanowires or nanopyramids.

The bottom contact is preferably ohmic.

Preferably the nanowires or nanopyramids grow about parallel to each other.

It will be appreciated that there are many planes within a substrate from which epitaxial growth could occur. It is preferred if substantially all nanowires or nanopyramids grow from the same plane. It is preferred if that plane is parallel to the substrate surface. Ideally the grown nanowires or nanopyramids are substantially parallel. Preferably, the nanowires or nanopyramids grow substantially perpendicular to the substrate.

The nanowires or nanopyramids of the invention should preferably grow in the <111> direction for nanowires or nanopyramids with cubic crystal structure. If the nanowire has a hexagonal crystal structure, then growth occurs in <0001> direction.

The nanowires or nanopyramids are preferably grown by MBE or MOVPE. In the MBE method, the graphene layer is provided with a molecular beam of each reactant, e.g. a group III element and a group V element preferably supplied simultaneously. A higher degree of control of the nucleation and growth of the nanowires or nanopyramids on the graphene layer might be achieved with the MBE technique by using migration-enhanced epitaxy (MEE) or atomic-layer MBE (ALMBE) where e.g. the group III and V elements can be supplied alternatively.

A preferred technique in case of nitrides is plasma assisted solid-source MBE, in which very pure elements such as gallium, aluminium, and indium are heated in separate effusion cells, until they begin to slowly evaporate. The rf-plasma nitrogen source is typically used to produce low energy beams of nitrogen atoms. The gaseous elements then condense on the graphene layer, where they may react with each other. In the example of gallium and nitrogen, single-crystal GaN is formed. The use of the term "beam" implies that evaporated atoms (e.g. gallium) and nitrogen atoms from the plasma source do not interact with each other or vacuum chamber gases until they reach the graphene layer.

MBE takes place in ultra high vacuum, with a background pressure of typically around $10^{-10}$ to $10^{-9}$ Torr. Nanostructures are typically grown slowly, such as at a speed of up to a few μm per hour. This allows nanowires or nanopyramids to grow epitaxially and maximises structural performance.

The nature of the light emitted is a function of the diameter and composition of the nanowire or nanopyramid. In order to tune the band gap of the nanowire or nanopyramid temperature and fluxes can be used. (Nanotechnology 25 (2014) 455201).

In the MOVPE method, the substrate/graphene layer is kept in a reactor in which the substrate/graphene layer is provided with a carrier gas and a metal organic gas of each reactant, e.g. a metal organic precursor containing a group III element and a metal organic precursor containing a group V element. The typical carrier gases are hydrogen, nitrogen, or a mixture of the two. A higher degree of control of the nucleation and growth of the nanowires or nanopyramids on the graphene layer might be achieved with the MOVPE technique by using pulsed layer growth technique, where e.g. the group III and V elements can be supplied alternatively.

Selective Area Growth of Nanowires or Nanopyramids

The nanowires or nanopyramids of the invention are preferably grown by selective area growth (SAG) method. This method may require a mask with nano-hole patterns deposited on the graphene layer, in the case where the NW's or NP's are grown by remote epitaxy on the graphene layer. The growth methods below equally apply to the case where the nanowires/nanopyramids are grown from the substrate/intermediate layer through the holes in a graphene mask (where technically viable).

In order to prepare a more regular array of nanowires or nanopyramids with better homogeneity in height and diameter of grown nanowires or nanopyramids, the inventors envisage the use of a mask on the graphene layer. This mask can be provided with regular holes, where nanowires or nanopyramids can grow homogeneously in size in a regular array across the substrate. The hole patterns in the mask can be easily fabricated using conventional photo/e-beam lithography or nanoimprinting. Focussed ion beam technology may also be used in order to create a regular array of nucleation sites on the graphene surface for the nanowire or nanopyramid growth.

Thus a mask can be applied to the graphene layer and etched with holes exposing the graphene layer surface, optionally in a regular pattern. Moreover, the size and the pitch of the holes can be carefully controlled. By arranging the holes regularly, a regular pattern of nanowires or nanopyramids can be grown. Where the graphene itself acts a hole mask, there is no need for an additional mask layer.

Moreover, the size of the holes can be controlled to ensure that only one nanowire or nanopyramid can grow in each hole. Finally, the holes can be made of a size where the hole is sufficiently large to allow nanowire or nanopyramid growth. In this way, a regular array of nanowires or nanopyramids can be grown.

By varying the size of the holes, one could control the size of the nanowire or nanopyramid. By varying the pitch of the holes, one could optimize the light extraction of light from the nanowires or nanopyramids.

The mask material can be any material which does not damage the underlying graphene layer when deposited. Preferred options include oxides, nitrides, and fluorides. The mask should also be transparent to the emitted light (LED) and entering light (photodetector). The minimum hole size might be 50 nm, preferably at least 100-200 nm. The thickness of the mask can be 10 to 100 nm, such as 10 to 40 nm.

The mask itself can be made of an inert compound, such as silicon dioxide or silicon nitride. In particular, the hole-patterned mask comprises at least one insulating material such as $SiO_2$, $Si_3N_4$, $MoO_2$, $W_2O_3$, BN (e.g. h-BN), AlN, $MgF_2$, $CaF_2$, $HfO_2$, $TiO_2$ or $Al_2O_3$ e.g. deposited by e-beam evaporation, CVD, PE-CVD, sputtering, or ALD. The mask can therefore be provided on the graphene layer surface by any convenient technique such as by electron beam deposition, CVD, plasma enhanced-CVD, sputtering, and atomic layer deposition (ALD).

The use of a Ti mask that is either nitridated/oxidized before the nanowire growth, is particularly preferred as such a mask has been found to allow growth of uniform NWs (e.g. see J. Crystal Growth 311(2009) 2063-68).

The selective area growth method yields nanowires or nanopyramids of uniform length, and diameter at predefined positions. The nanowires or nanopyramids can also be grown without mask with nano-hole patterns. In such case, the nanowires or nanopyramids will have non-uniform sizes (length and diameter), and located at random positions. In one embodiment, it is preferred if no mask is used to grow the nanowires or nanopyramids of the invention. Moreover, the present inventors have found that nanowire density can be maximised in the absence of a mask. Nanowire densities of at least 20 nanowires per square micrometer are possible, such as at least 25 nanowires per square micrometer. These very high nanowire densities are particularly associated with GaN or AlGaN nanowires.

For the nanowire or nanopyramid growth, the graphene temperature can then be set to a temperature suitable for the growth of the nanowire or nanopyramid in question. The growth temperature may be in the range 300 to 1000° C. The temperature employed is, however, specific to the nature of the material in the nanowire or nanopyramid and the growth method. For GaN grown by MBE, a preferred temperature is 700 to 950° C., e.g. 750 to 900° C., such as 760° C. For AlGaN the range is slightly higher, for example 780 to 980° C., such as 830 to 950° C., e.g. 840° C.

It will be appreciated therefore that the nanowires or nanopyramids can comprise different group III-V semiconductors within the nanowire or nanopyramid, e.g. starting with a GaN stem followed by an AlGaN component or AlGaInN component and so on.

Nanowire or nanopyramid growth in MBE can be initiated by opening the shutter of the Ga effusion cell, the nitrogen plasma cell, and the dopant cell simultaneously initiating the growth of doped GaN nanowires or nanopyramids, hereby called as stem. The length of the GaN stem can be kept between 10 nm to several 100s of nanometers. Subsequently, one could increase the substrate temperature if needed, and open the Al shutter to initiate the growth of AlGaN nanowires or nanopyramids. One could initiate the growth of AlGaN nanowires or nanopyramids on graphene layers without the growth of GaN stem. n- and p-type doped nanowires or nanopyramids can be obtained by opening the shutter of the n-type dopant cell and p-type dopant cell, respectively, during the nanowire or nanopyramid growth. For example, Si dopant cell for n-type doping of nanowires or nanopyramids, and Mg dopant cell for p-type doping of nanowires or nanopyramids.

The temperature of the effusion cells can be used to control growth rate. Convenient growth rates, as measured during conventional planar (layer by layer) growth, are 0.05 to 2 μm per hour, e.g. 0.1 μm per hour. The ratio of Al/Ga can be varied by changing the temperature of the effusion cells.

The pressure of the molecular beams can also be adjusted depending on the nature of the nanowire or nanopyramid being grown. Suitable levels for beam equivalent pressures are between $1 \times 10^{-7}$ and $1 \times 10^{-4}$ Torr.

The beam flux ratio between reactants (e.g. group III atoms and group V molecules) can be varied, the preferred flux ratio being dependent on other growth parameters and on the nature of the nanowire or nanopyramid being grown. In the case of nitrides, nanowires or nanopyramids are always grown under nitrogen rich conditions.

The nanowires or nanopyramids of the invention preferably comprise n-p or n-i-p Al(In)GaN or AlGaN nanowires or nanopyramids. The active layer (i-region) could consist of $Al_{x1}Ga_{y1}N/Al_{x2}Ga_{y2}N$ (x1>x2 and x1+y1=x2+y2=1) multiple quantum wells or superlattice structure. The p-region could include/comprise an electron blocking layer (single or multiple quantum barrier layers) to prevent the overflow of minority carriers (electrons) into the p-region.

It is thus a preferred embodiment if the nanowire or nanopyramid is provided with a multiple quantum well. It is thus a preferred embodiment if the nanowire or nanopyramid is provided with an electron blocking layer. Ideally, the nanowire or nanopyramid is provided with both an electron blocking layer and a multiple quantum well.

It is thus an embodiment of the invention to employ a multistep, such as two step growth procedure, e.g. to separately optimize the nanowire or nanopyramid nucleation and nanowire or nanopyramid growth.

A significant benefit of MBE is that the growing nanowire or nanopyramid can be analysed in situ, for instance by using reflection high-energy electron diffraction (RHEED). RHEED is a technique typically used to characterize the surface of crystalline materials. This technology cannot be applied so readily where nanowires or nanopyramids are formed by other techniques such as MOVPE.

A significant benefit of MOVPE is that the nanowires or nanopyramids can be grown at a much faster growth rate. This method favours the growth of radial heterostructure nanowires or nanopyramids and microwires, for example: n-type doped GaN core with shell consisting of intrinsic AlN/Al(In)GaN multiple quantum wells (MQW), AlGaN electron blocking layer (EBL), and p-type doped (Al)GaN shell. This method also allows the growth of axial heterostructured nanowire or nanopyramid using techniques such as pulsed growth technique or continuous growth mode with modified growth parameters for e.g., lower V/III molar ratio and higher substrate temperature.

In more detail, the reactor must be evacuated after placing the sample, and is purged with $N_2$ to remove oxygen and water in the reactor. This is to avoid any damage to the graphene at the growth temperatures, and to avoid unwanted reactions of oxygen and water with the precursors. The total pressure is set to be between 50 and 400 Torr. After purging the reactor with $N_2$, the graphene layer is thermally cleaned under $H_2$ atmosphere at a substrate temperature of about 1200° C. The substrate temperature can then be set to a temperature suitable for the growth of the nanowire or nanopyramid in question. The growth temperature may be in the range 700 to 1200° C. The temperature employed is, however, specific to the nature of the material in the nanowire or nanopyramid. For GaN, a preferred temperature is 800 to 1150° C., e.g. 900 to 1100° C., such as 1100° C. or 1000° C. For AlGaN the range is slightly higher, for example 900 to 1250° C., such as 1050 to 1250° C., e.g. 1250° C. or 1150° C.

The metal organic precursors can be either trimethylgallium (TMGa), or triethylgallium (TEGa) for Ga, trimethylalumnium (TMAl) or triethylalumnium (TEAl) for Al, and trimethylindium (TMIn) or triethylindium (TEIn) for In. The precursors for dopants can be $SiH_4$ for silicon and bis(cyclopentadienyl)magnesium ($Cp_2Mg$) or bis(methylcyclopentadienyl)magnesium (($MeCp)_2Mg$) for Mg. The flow rate of TMGa, TMAl and TMIn can be maintained between 5 and 100 sccm. The $NH_3$ flow rate can be varied between 5 and 150 sccm.

In particular, the simple use of vapour-solid growth may enable nanowire or nanopyramid growth. Thus, in the context of MBE, simple application of the reactants, e.g. In and N, to the graphene layer without any catalyst can result in the formation of a nanowire or nanopyramid. This forms a further aspect of the invention which therefore provides the direct growth of a semiconductor nanowire or nanopyramid formed from the elements described above on a graphene layer. The term direct implies therefore the absence of a catalyst to enable growth.

Viewed from another aspect the invention provides a composition of matter comprising a plurality of group III-V nanowires or nanopyramids grown epitaxially on a polycrystalline or single-crystalline graphene layer and a crystalline substrate which directs the nanowire growth, preferably through the holes of a hole-patterned mask on said graphene layer, said nanowires or nanopyramids comprising:

an n-type doped region and a p-type doped region separated by an intrinsic region which acts as a multiple quantum well, said p-type doped region comprising an electron blocking layer.

Said regions can be represented by layers within a nanowire or nanopyramid or shells on a core to create the nanowire or nanopyramid. Thus, the invention further provides a plurality of radial group III-V nanowires or nanopyramids grown epitaxially on a graphene layer and a substrate which directs the nanowire growth comprising, in this order, an n-type doped core with shell comprising an intrinsic multiple quantum well, an electron blocking shell (EBL), and p-type doped shell. The n-type doped region could include/comprise a hole blocking layer (single or multiple quantum barrier layers) to prevent the overflow of minority charge carriers (holes) into the n-type doped region.

Graphene-Hole Mask

In order to position the nanowires/nanopyramids, it is known to use a mask with a hole array pattern where nanowires/nanopyramids are allowed to grow only/mainly in the hole-patterned area. The mask can also promote growth in a direction perpendicular to the substrate. Typically, a silica layer is applied to a substrate and etched to create holes in a desired pattern. Nanowires/nanopyramids then grow only/mainly at the location of the holes. Mask layers have been used in conjunction with nanowire growth on graphene (see WO2013/104723).

As discussed above, in another embodiment of the invention, the inventors have appreciated that a graphene layer can be etched to form holes for positioned NW or NP growth from the substrate or from an intermediate layer below the graphene. Surprisingly, the hole-patterned graphene layer is still able to act as an electrode for the NW or NPs despite these growing from the substrate (or intermediate layer) and not on the graphene layer itself. It is envisaged that as contact is made between the edges of the graphene layer and the edges of the NWs or NPs that an electrical contact occurs.

In a further embodiment of the invention, therefore, the invention provides for the use of a graphene hole mask on the crystalline substrate. In this embodiment, the nanowires/nanopyramids grow through the holes in the graphene mask directly on the crystalline substrate, or on an intermediate layer positioned between the crystalline substrate and the graphene layer. The inventors have realised that this arrangement enables direct epitaxial growth of the NWs/NPs on the substrate/intermediate layer, with the advantage that any additional nanostructures that have grown on top of the graphene directly, i.e. not in the holes, can also be epitaxial with the intermediate layer/crystalline substrate beneath the graphene through remote epitaxy. This can lead to structural and optical/electrical benefits, especially when the NWs/NPs are grown to coalesce.

In a further embodiment of the invention, therefore, the invention provides a composition of matter comprising:

a sapphire, Si, SiC, $Ga_2O_3$ or group III-V semiconductor substrate;

an intermediate group III-V semiconductor layer directly on top of said substrate;

a graphene layer directly on top of said intermediate layer;

wherein a plurality of holes are present through said graphene layer; and wherein a plurality of nanowires or nanopyramids are grown from said intermediate layer in said holes, said nanowires or nanopyramids comprising at least one semiconducting group III-V compound.

In a further aspect, the invention provides a composition of matter comprising:

a graphene layer carried directly on a sapphire, Si, SiC, $Ga_2O_3$ or group III-V semiconductor substrate;

wherein a plurality of holes are present through said graphene layer; and wherein a plurality of nanowires or nanopyramids are grown from said substrate in said holes, said nanowires or nanopyramids comprising at least one semiconducting group III-V compound.

In these embodiments, the graphene layer is typically grown directly on the substrate or on the intermediate layer. Crucially, the graphene layer can act as an electrode to the nanowires or nanopyramids that are grown from the substrate or intermediate layer. Typically, therefore, the graphene layer is in electrical contact with at least a portion of the nanowires or nanopyramids.

Substrate Layer when a Graphene Hole Mask is Used

The substrate in this particular embodiment can be the same as the crystalline substrate discussed above. In addition, the following applies.

In the embodiment with the graphene hole mask, the nanowires and nanopyramids can grow from the substrate and hence it is preferred that the substrate is a crystalline substrate. Suitable substrates include sapphire, Si, SiC, $Ga_2O_3$, or a group III-V semiconductor substrate such as GaN, AlN, GaAs, and so on. The $Ga_2O_3$ in all embodiments of the invention is preferably $\beta$-$Ga_2O_3$. Suitable group III-V semiconductors are those described above in context with the nanowires or nanopyramids.

Moreover, for the group III-V semiconductor option, group III options are B, Al, Ga, In, and Tl. Preferred options here are Ga, Al and In. Group V options are N, P, As, Sb. A preferred option is N. It is of course possible to use more than one element from group III and/or more than one element from group V for the substrate layer. Preferred III-V semiconductor compounds for the substrate layer include BN, AlAs, GaSb, GaP, GaN, AlN, AlGaN, AlGaInN, GaAs, InP, InN, InGaN, InGaAs, InSb, InAs, or AlGaAs. Compounds based on Al, Ga and In in combination with N are one option. The use of GaN, AlGaN, AlInGaN or AlN is highly preferred. These materials have strong ionic forces which can result in enhanced remote epitaxy (see discussion above and below). AlN is particularly preferred, because it not only has strong ionic forces but is also UVC transparent and therefore better suited for flip chip UVC LEDs. AlN has much stronger ionic forces than, for example, sapphire, and these aid to induce a higher yield of remote epitaxy of the group III-V island growth on graphene.

Mixtures of the above substrate materials may also be used. Particularly preferred options include sapphire, GaN, GaN/Sapphire; AlGaN, AlGaN/Sapphire; AlN, AlN/Sapphire, Si; GaN/Si; AlGaN/Si; AlN/Si, SiC; GaN/SiC; AlGaN/SiC; AlN/SiC. Highly preferred options include $Ga_2O_3$ or $(Al_xGa_{1-x})_2O_3$. The combinations AlN/Sapphire, AlN/Si or AlN/SiC are particularly preferred, in particular, AlN/Sapphire. In the nomenclature above, the first compound in the grouping (i.e. the compound before the '/') is typically an intermediate layer, and the second compound is the substrate beneath the intermediate layer. Intermediate layers are discussed in more detail below.

Substrates can be crystalline and may have a crystal orientation of [111], [110], or [100] perpendicular to the surface.

The use of sapphire with a crystal orientation [0001] is especially preferred.

In a particular embodiment, the use of a sapphire, SiC, $Ga_2O_3$ or group III-V semiconductor substrate is preferred (particularly group III-V semiconductor substrate), as this can result in remote epitaxy through the graphene layer and influence the growth of nanostructures on top of the graphene, in the case where there is no intermediate layer. In a particular embodiment, group III-V semiconductor substrates are preferred (e.g. AlN), especially where there is no intermediate layer present.

In a particular embodiment, the substrate is selected from sapphire, Si, SiC, $Ga_2O_3$ or a group III-V semiconductor substrate when there is an intermediate layer, or from a sapphire, SiC, $Ga_2O_3$ or group III-V semiconductor substrate when there is no intermediate layer (as these can lead to remote epitaxial effects). In a particular embodiment, therefore, the invention provides a composition of matter comprising:

a substrate;

an optional intermediate group III-V semiconductor layer directly on top of said substrate;

a graphene layer directly on top of said intermediate layer if present, or on top of the substrate;

wherein a plurality of holes are present through said graphene layer; and wherein a plurality of nanowires or nanopyramids are grown from said substrate or from said intermediate layer in said holes, said nanowires or nanopyramids comprising at least one semiconducting group III-V compound;

wherein when an intermediate layer is present, the substrate is selected from sapphire, Si, SiC, $Ga_2O_3$ or a group III-V semiconductor substrate, and when there is no intermediate layer, the substrate is selected from sapphire, SiC, $Ga_2O_3$ or a group III-V semiconductor substrate.

Intermediate Layer/Remote Epitaxy/Nanoislands when a Graphene Hole Mask is Used

In a particular embodiment, the substrate has an intermediate layer positioned on top of it. Such an intermediate layer is positioned between the substrate and the graphene layer. In other words, the composition comprises the substrate, the intermediate layer and the graphene layer in that order.

The intermediate layer is formed from at least one III-V compound. In case the semiconductor substrate is a group III-V semiconductor substrate, then the intermediate layer is formed from a different group III-V compound. Typically the intermediate layer is crystalline.

Group III options are B, Al, Ga, In, and Tl. Preferred options here are Ga, Al and In. Group V options are N, P, As, Sb. A preferred option is N. It is of course possible to use more than one element from group III and/or more than one element from group V for the intermediate layer. Preferred compounds for the intermediate layer include BN, AlAs, GaSb, GaP, GaN, AlN, AlGaN, AlGaInN, GaAs, InP, InN, InGaN, InGaAs, InSb, InAs, or AlGaAs. Compounds based on Al, Ga and In in combination with N are one option. The use of GaN, AlGaN, AlInGaN or AlN is highly preferred. These materials have strong ionic forces which can result in enhanced remote epitaxy (see discussion below). AlN is particularly preferred, because it not only has strong ionic forces but is also UVC transparent and therefore better suited for flip chip UVC LEDs. AlN has much stronger ionic forces than, for example, sapphire, and these aid to induce a higher yield of remote epitaxy of the group III-V island growth on graphene.

In a particular embodiment, there is a remote epitaxial relationship between the intermediate layer and the semiconductor nanostructures grown on top of the graphene layer. In another embodiment, there is a remote epitaxial relationship between the substrate and the semiconductor nanostructures grown on top of the graphene layer.

In a particular embodiment, the intermediate layer has a thickness of less than 200, preferably less than 100 nm, more preferably less than 75 nm, e.g. of around 50 nm. Suitable thickness ranges include 1-200 nm, preferably 10-100 nm, e.g. 25-75 nm.). The use of a thin intermediate layer enables remote epitaxial effects to take place without having to use an entire substrate made of expensive semiconductor material.

Often, it can be difficult to prevent growth on top of the graphene layer outside of the holes (i.e. growth of so-called 'nanoislands'). There is therefore a need to ensure that any group III-V structure growing on top of the graphene is of high crystallinity. This is particularly important for cases of 'coalescence', i.e. where the positioned nanowires/nanopyramids growing through the holes are joined up.

As discussed above, remote epitaxy is the phenomenon whereby a very thin layer of graphene is used, and nanostructures (or even thin films) can be grown epitaxially, with the crystal orientation of the nanostructures matching the underlying substrate rather than the graphene layer even if the graphene is polycrystalline. Despite, therefore, the graphene layer acting as a buffer between the substrate or intermediate layer and the nanostructures, they will still grow with a crystal direction/facet direction that reflects the substrate or intermediate layer rather than the graphene. The resulting nanowire array is more regular with parallel facets even when the graphene is polycrystalline. This improves the various properties of the material.

In the embodiment with the graphene hole mask, the nanowires/nanopyramids grow such that the crystal orientation and facet orientations of said nanowires or nanopyramids are directed by the crystalline substrate/intermediate layer. Thus the crystal orientation and facet orientations are the same for all nanowires/nanopyramids.

When remote epitaxy occurs, the growing nanostructures adopt their crystal (and thus facet) orientation from the crystalline layer underneath the graphene layer. The nanostructures can be considered therefore to have parallel facets. In contrast, where nanostructures grow epitaxially from polycrystalline graphene, then the resulting nanowire facets are randomly oriented in different domains/grains, i.e., whereas the sides (facets) of hexagonal nanowires can be parallel within one graphene domain/grain, they are not parallel to but are at random orientation relative the sides (facets) of hexagonal nanowires within neighboring graphene domains/grains. Nanowires can be hexagonal or square in cross section, preferably hexagonal. Remote epitaxy occurs where all crystal and facet orientations are the same.

The use of an intermediate layer, preferably when there is no additional hole-mask on top of graphene, is a particular embodiment which can lead to higher quality growth for nanoislanding taking place on top of the graphene hole mask. In a particular embodiment, therefore, the composition comprises a graphene hole mask, and with an intermediate layer, preferably AlN, between the substrate and the graphene. In a particular embodiment, there is no oxide, nitride or fluoride masking layer. This setup has the benefits of 1) improving the selectivity and 2) inducing remote epitaxy for the group III-V islanding on the graphene hole-mask that often cannot be completely avoided.

This remote epitaxy results in the group III-V islanding (i.e. the nanoislands formed on the graphene) being in-plane epitaxial with the group III-V nanowires/nanopyramids so that no defects are created in the case that the nanowires/nanopyramids coalesce. In a particular embodiment, therefore, the composition of matter of the present invention comprises group III-V nanoislands nucleated by remote epitaxy on the graphene (i.e. they have not been grown on the intermediate/substrate layer through the holes in the graphene). Typically, the nanoislands are formed of the same material as the nanowires/nanopyramids. This is because nanoisland growth occurs at the same time as NW/NP growth. The definitions of group III-V materials for the NWs and NPs are thus applicable to the nanoislands. 'Nanoislands' covers nanopyramids, nanowires, nanomesas, and other structures, and is used herein to differentiate the structure from the nanowires/nanopyramids grown in the holes of the graphene. Preferably, the epitaxy, crystal orientation and facet orientations of said nanoislands are directed by the intermediate layer. Typically, therefore, the crystal orientation of the nanoislands matches that of the nanowires and nanopyramids (which have grown in the holes) and of the intermediate layer.

The use of remote epitaxy can lead to improved electrical/optical properties in the final device.

Coalescence

It can be beneficial to form large area structures through coalescence of positioned nanowires/nanopyramids. Coalescence refers to the side-on joining of two or more nanostructures during growth, typically through un-avoidable merging of 'island' nanostructures which have been grown in between them. This results in a 2D or 3D structure. Such a coalesced structure typically resembles a corrugated (non-planar) thin film with pyramidal tips at the surface, i.e. the coalesced structure is typically ridged. In a particular embodiment, the coalesced structure is not planar. It is thus typically distinct from a planar thin film which has been grown on a substrate. For coalescence, the nanostructures must preferably have their crystal lattices in the same orientation, such that the formation of gaps and dislocations can largely be eliminated, i.e. the coalescing nanowires/nanopyramids and merging nanoislands must preferably have nearly identical epitaxial relationship with respect to the substrate/intermediate layer.

For coalescence it is preferred if there is no additional mask layer on top of the graphene, i.e. preferably no oxide/nitride/fluoride mask layer, since this is amorphous and may lead to low crystallinity in the coalesced structure.

In a particular embodiment, at least some or all of the nanowires/nanopyramids are coalesced. The coalesced structure may include nanostructures which have grown in between the nanowires/nanopyramids, on the graphene itself, e.g. nanoislands.

The use of a substrate/intermediate layer that promotes remote epitaxy through a graphene hole mask is particularly beneficial for coalescence, since not only are the crystal orientations and facet orientations of the nanowires/nanopyramids aligned with the substrate/intermediate layer, but any nanoislands formed on the graphene, i.e. outside of the holes, are also lattice matched with the substrate/intermediate layer by remote epitaxy. The nanoislands formed on the graphene can therefore form part of the coalesced structure with the nanowires/nanopyramids. Because of the remote epitaxy effect, the coalesced structure shows high crystallinity and is substantially defect free. Typically, very few or no dislocations or stacking faults are observed. Without remote-epitaxy, a defective and dead "active" region in-between the nanowires/nanopyramids would be obtained when the nanowires/nanopyramids coalesce.

Patterning

When a graphene hole mask is used, the positioned nanowires or nanopyramids need to grow from the substrate or the intermediate layer. That means that holes need to be patterned through the graphene layer. Making of these holes is a well-known process and can be carried out using e-beam lithography or any other known techniques. The hole patterns in the mask can be easily fabricated using conventional lithography techniques such as photo/e-beam lithography, nanoimprinting, and so on. Focussed ion beam technology may also be used in order to create a regular array of nucleation sites on the substrate surface or intermediate layer surface for the nanowire or nanopyramid growth. The holes created in the graphene layer can be arranged in any pattern which is desired.

The diameter of the holes is preferably up to 500 nm, such as up to 100 nm, ideally up to 20 to 200 nm. The diameter of the hole sets a maximum diameter for the size of the nanowires or nanopyramids so the hole size and nanowire or nanopyramid diameters should match. However, nanowire or nanopyramid diameter larger than the hole size could be achieved by changing the growth parameters or by adopting a core-shell nanowire or nanopyramid geometry. If a shell is applied to the nanowire, the base of that shell grows on top of the graphene layer. Thus, the base of the nanowire contacts the graphene layer making a stronger electrical contact.

The number of holes is a function of the area of the substrate (and optionally intermediate layer) and desired nanowire or nanopyramid density.

The shape of the holes is not limited. Whilst these may be circular, holes may also be in other shapes, such as triangular, rectangles, oval etc.

As the nanowires or nanopyramids begin growing within a hole, this tends to ensure that the initial growth of the nanowires or nanopyramids is substantially perpendicular to the substrate. This is a further preferred feature of the invention. One nanowire or nanopyramid preferably grows per hole.

Top Contact

In order to create a device of the invention, the top of the nanowires or nanopyramids needs to comprise a top electrode and, for the LED embodiment preferably a reflective layer. In some embodiments, these layers can be one in the same.

In one preferred embodiment, a top contact is formed using another graphene layer. The invention then involves placing a graphene layer on top of the formed nanowires or nanopyramids to make a top contact. It is preferred that the graphene top contact layer is substantially parallel with the lower graphene layer. It will also be appreciated that the area of the graphene layer does not need to be the same as the area of the other graphene layer. It may be that a number of graphene layers are required to form a top contact with a graphene layer with an array of nanowires or nanopyramids.

The graphene layers used can be the same as those described in detail above. This graphene top contact should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). It is preferred if the top contact is 20 nm in thickness or less. Even more preferably, the graphene top contact may be 5 nm or less in thickness.

When graphene contacts directly to the semiconductor nanowires or nanopyramids, it usually forms a Schottky contact which hinders the electrical current flow by creating a barrier at the contact junction. Due to this problem, the research on graphene deposited on semiconductors has been mainly confined to the use of graphene/semiconductor Schottky junctions.

Application of the top contact to the formed nanowires or nanopyramids can be achieved by any convenient method. Methods akin to those mentioned previously for transferring graphene layers to substrates may be used. The graphene layers from Kish graphite, highly ordered pyrolytic graphite (HOPG), or CVD may be exfoliated by mechanical or chemical methods. Then they can be transferred into etching solutions such as HF or acid solutions to remove Cu (Ni, Pt, etc.) (especially for CVD grown graphene layers) and any contaminants from the exfoliation process. The etching solution can be further exchanged into other solutions such as deionised water to clean the graphene layers. The graphene layers can then be easily transferred onto the formed nanowires or nanopyramids as the top contact. Again e-beam resist or photoresist may be used to support the thin graphene layers during the exfoliation and transfer processes, which can be removed easily after deposition.

It is preferred if the graphene layers are dried completely after etching and rinsing, before they are transferred to the top of the nanowire or nanopyramid arrays. To enhance the contact between graphene layers and nanowires or nanopyramids a mild pressure and heat can be applied during this "dry" transfer.

Alternatively, the graphene layers can be transferred on top of the nanowire or nanopyramid arrays, together with a solution (e.g. deionised water). As the solution dries off, the graphene layers naturally form a close contact to underlying nanowires or nanopyramids. In this "wet" transfer method, the surface tension of the solution during the drying process might bend or knock out the nanowire or nanopyramid arrays. To prevent this, where this wet method is used, more robust nanowires or nanopyramids are preferably employed. Nanowires or nanopyramids having a diameter of >80 nm might be suitable. Alternatively, hole patterned masks which support the vertical nanowire or nanopyramid structure could be used. One may also use the critical-point drying technique to avoid any damage caused by surface tension during the drying process. Another way to prevent this is to use supporting and electrically isolating material as fill-in material between nanowires or nanopyramids. The fill-in material needs to be transparent to the emitted light. We discuss the use of fillers below.

If there is a water droplet on a nanowire or nanopyramid array and attempts to remove it involve, for example a nitrogen blow, the water drop will become smaller by evaporation, but the drop will always try to keep a spherical form due to surface tension. This could damage or disrupt the nanostructures around or inside the water droplet.

Critical point drying circumvents this problem. By increasing temperature and pressure, the phase boundary between liquid and gas can be removed and the water can be removed easily.

Also doping of the graphene top contact can be utilized. The major carrier of the graphene top contact can be controlled as either holes or electrons by doping. It is preferable to have the same doping type in the graphene top contact and in the semiconducting nanowires or nanopyramids.

It will be appreciated therefore that both top graphene layer and the graphene layer can be doped. In some embodiments, the graphene layers can be doped by a chemical method which involves with an adsorption of organic or inorganic molecules such as metal chlorides ($FeCl_3$, $AuCl_3$ or $GaCl_3$), $NO_2$, $HNO_3$, aromatic molecules or chemical solutions such as ammonia.

The surface of graphene layers could also be doped by a substitutional doping method during its growth with incorporation of dopants such as B, N, S, or Si.

Reflective Layer/Electrode

The device is provided with two electrodes. A first electrode is placed in contact with the graphene layer. That electrode might be based on a metal element such as Ni, Au, Ti, or Al or a mixture thereof or a stack thereof, such as a stack Ti/Al/Ni/Au. Pd, Cu or Ag might also be used. Often the first electrode will be the n electrode. The electrode may be on either surface of the graphene layer, preferably on the same surface as the grown nanowires or nanopyramids.

A second electrode is placed as a top contact on top of the grown nanowires or nanopyramids. This electrode will often be the p electrode. It is preferred if this forms a good ohmic contact with the nanowires or nanopyramids. Suitable electrode materials include Ni, Ag, Pd and Cu. In particular, a Ni/Au stack could be used. This electrode might also act as a heat sink. As discussed below in further detail, the LED device of the invention is preferably in the form of a flip chip. The top contact electrode therefore sits at the bottom of the flip chip assembly. It is therefore preferred if the electrode either reflects light or is provided with a light-reflective layer. The light-reflective layer is ideally metallic. The light-reflective contact layer can be formed in several ways, although using a PVD (Physical Vapour Deposition) method and well-known mask techniques is the preferred method. The reflector is preferably made of aluminum or silver, but other metals or metal alloys may also be used. The purpose of the light-reflective layer is to prevent light from leaving the structure in a direction other than the preferred direction, and to focus the emitted light to one single direction. Additionally, the light-reflective layer may function as a top contact electrode to the nanowires or nanopyramids. The light emitted by the LED is channeled in a direction opposite to the reflective layer, i.e. out the top of the flip-chip. Where a graphene top contact layer is present, a light-reflective layer is preferably additionally present.

The reflective layer needs to reflect light and may also act as a heat sink. Suitable thickness are 20 to 400 nm, such as 50 to 200 nm.

In the photodetector embodiment, there is no need to use a reflective layer but such a layer could be used, perhaps to reflect incoming light onto the nanowires or nanopyramids to enhance photodetection.

Filler

It is within the scope of the invention to use a filler to surround the flip chip assembly as long as the filler is transparent, e.g. to UV light. Filler may be present in the space between nanowires or nanopyramids and/or around the assembly as a whole. Different fillers might be used in the spaces between the nanowires or nanopyramids than in the assembly as a whole. The presence of a filler gives strength to the material.

In one embodiment, the graphene layer, with nanowires or nanopyramids that have been grown epitaxially therefore with an orientation based on the substrate, can be separated from the substrate to allow reuse of that substrate for nanowire or nanopyramid growth. Removal of the substrate also avoids any issues with substrate transparency. In any electronic device of the invention, the semiconductor nanowires/nanopyramids can be used with or without the substrate on which they were grown. What is important however is that the substrate is used during the growth process to enable the formation of nanowires/nanopyramids with parallel facets.

Applications

The invention relates to LEDs, in particular UV LEDs and especially UV-A, UV-B, or UV-C LEDs. The LEDs are preferred designed as a so called "flip chip" where the chip is inverted compared to a normal device.

The whole LED arrangement can be provided with contact pads for flip-chip bonding distributed and separated to reduce the average series resistance. Such a nanostructured LED can be placed on a carrier having contact pads corresponding to the position of p-contact pads and n-contact pads on the nanowire or nanopyramid LED chip and attached using soldering, ultrasonic welding, bonding or by the use of electrically conductive glue. The contact pads on the carrier can be electrically connected to the appropriate power supply lead of the LED package.

Nanowire-based LED devices as such, are usually mounted on a carrier that provides mechanical support and electrical connections. One preferred way to construct a LED with improved efficiency is to make a flip-chip device. A light reflective layer with high reflectivity is formed on top of the nanowires or nanopyramids. The substrate can be removed as a part of the process, leaving the graphene layer as an electrode that allow for the light to be emitted through said layer which has formed a base for the nanowires or nanopyramids. If the substrate is transparent then of course there is no requirement to remove it. The support can be sufficiently transparent to allow for light to be emitted through said substrate layer. Similar considerations apply to the intermediate layer, if present. In a particular embodiment, the intermediate layer is transparent. Emitted light directed towards the top of the nanowires or nanopyramids is reflected when it encounters the reflective layer, thus creating a clearly dominating direction for the light leaving the structure. This way of producing the structure allows for a much larger fraction of the emitted light to be guided in a desired direction, increasing the efficiency of the LED. The invention therefore enables the preparation of visible LEDs and UV LEDs.

The invention also relates to photodetectors in which the device absorbs light and generates a photocurrent. The light reflective layer may reflect light entering the device back on to the nanowires or nanopyramids for enhanced light detection.

The invention will now be further discussed in relation to the following non limiting examples and figures.

Figure 1:
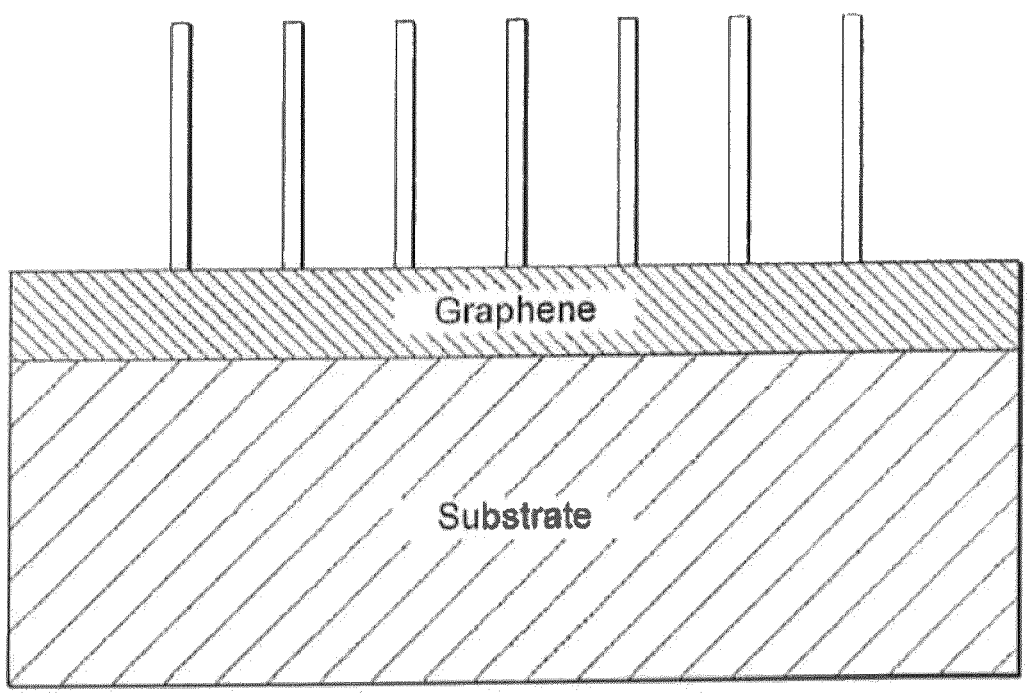
FIG. 1 shows a composition of matter of the invention with nanowires grown on a thin polycrystalline or single-crystalline graphene layer directly supported on a crystalline substrate where the epitaxy is dictated by the crystalline substrate.
Figure 2:
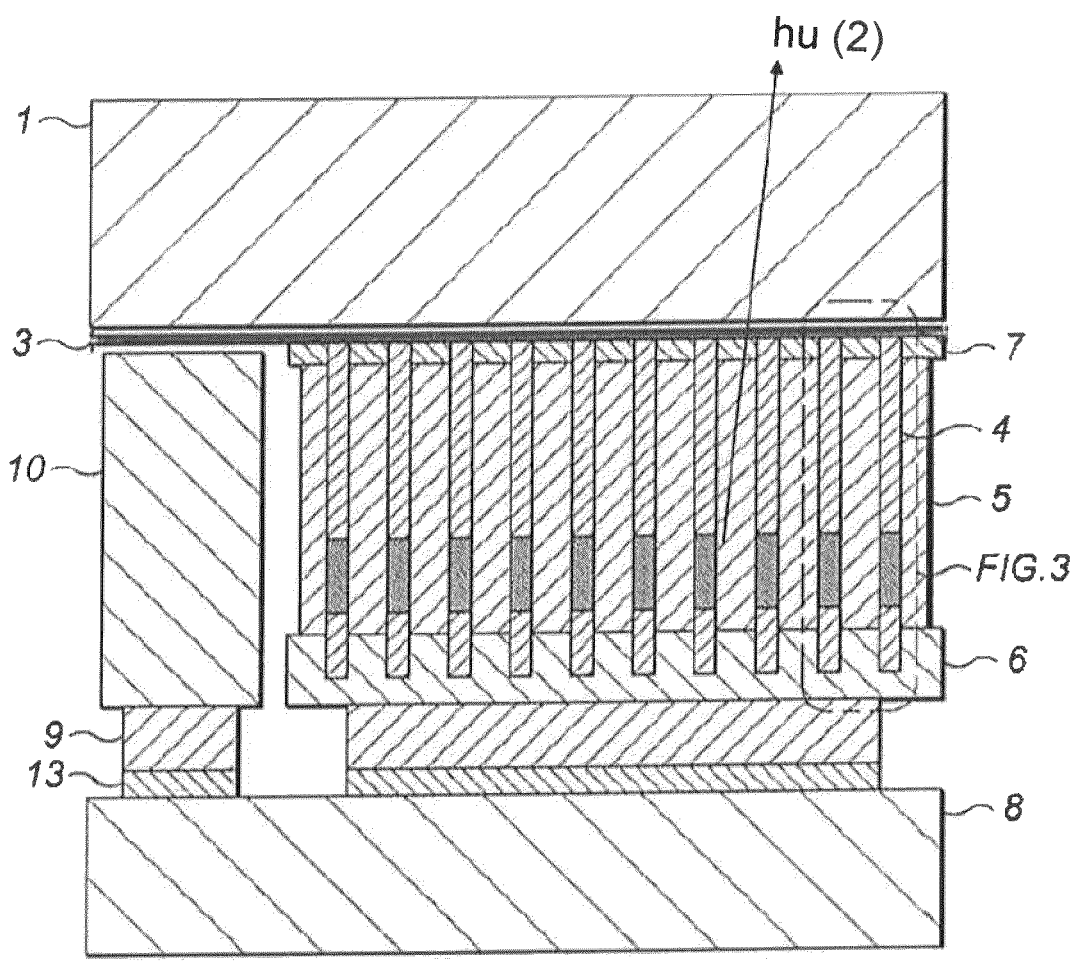
FIG. 2 shows a possible flip chip design. In use therefore, light is emitted through the top of the device (2) (marked hu). Crystalline substrate 1 is preferably formed from sapphire or AlN. The use of other crystalline transparent substrates is also possible. In use, the substrate, if still present, is positioned upper most in the device and hence it is important that the substrate is transparent to the emitted light and thus allows light out of the device.

Layer 3 is the polycrystalline or single-crystalline graphene layer which can be one atomic layer thick.

Nanowires 4 are grown from the polycrystalline or single-crystalline graphene layer 3 employing remote epitaxy. Ideally, the nanowires are formed from Al(In)GaN, AlN or GaN and are doped to create n-i-p or n-p junctions.

A filler 5 can be positioned between grown nanowires. A top electrode/light reflective layer 6 is positioned on top of nanowires 4. The light-reflective layer may also be provided with a p-electrode comprising Ni or Au. In use, this layer reflects any light emitted by the device to ensure that the light is emitted through the top of the device opposite the reflective layer. This is the so-called flip chip arrangement as the device is upside down compared to a conventional LED.

Electrode 10 is positioned on the polycrystalline or single-crystalline graphene layer 3. That electrode might comprise Ti, Al, Ni or/and Au. The graphene layer may be provided with a mask 7 to allow growth of the nanowires in definitive positions on the polycrystalline or single-crystalline graphene.

The whole device is soldered to conductive tracks/pads 13 on a submount 8 via solder layer 9.

When a forward current is passed across the device, visible or UV light, dependent on composition of matter, is generated in the nanowires and is emitted, possibly after reflecting off the reflective layer out the top of the device.

When a reverse current is passed across the device and when the device is exposed to visible or UV light, the nanowires absorb the visible or UV light, dependent on composition of matter, and converts it into current, working as a photodetector.

Figure 3:
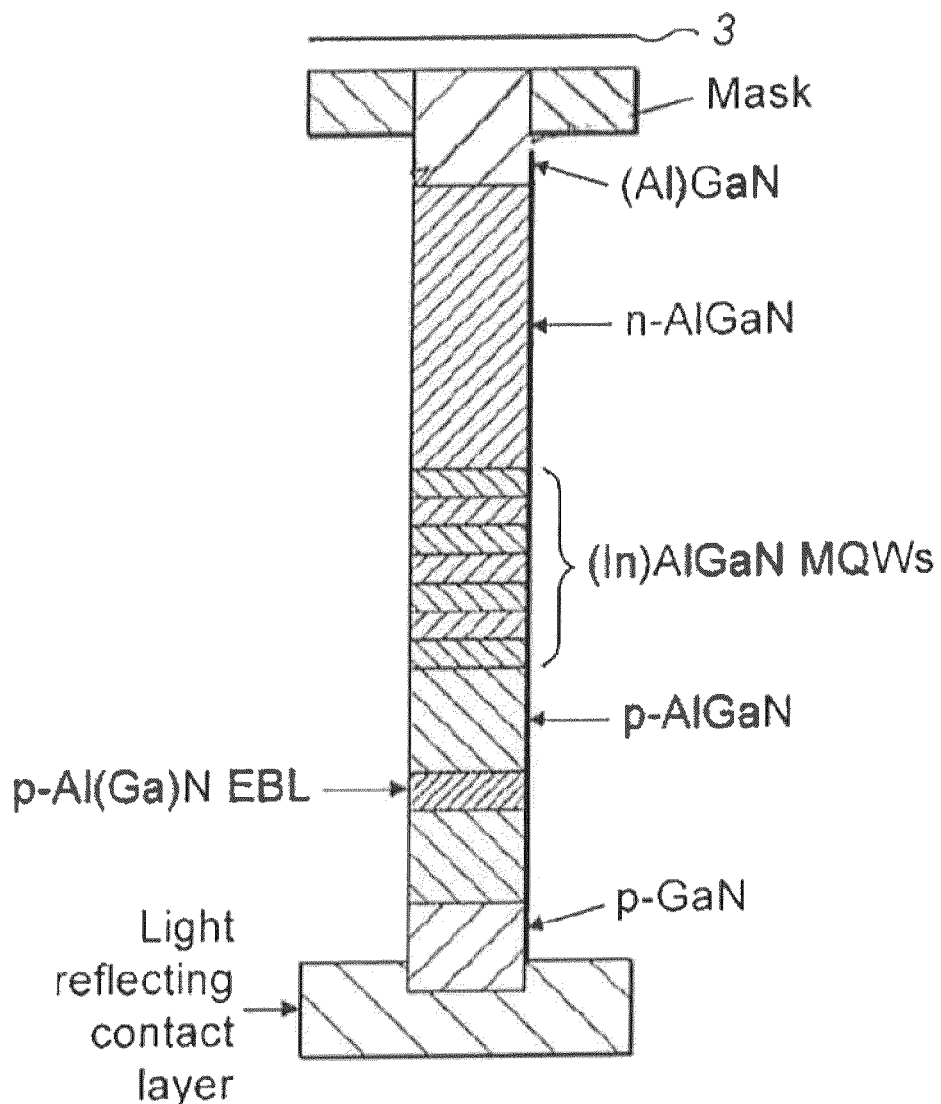

FIG. 3 shows a potential nanowire of the invention. The nanowire is provided with different components in an axial direction by variation of the elements being supplied during the growing phase. Initially, an n-type doped GaN, or preferably an n-type AlGaN, material is deposited, followed by n-AlGaN. In the central section of the nanowire as shown are a series of multiple quantum wells formed from (In)(Al)GaN. Then follows the p-type doped region based on AlGaN, and an electron blocking layer based on p-Al(Ga)N and finally a p-GaN layer.

Figure 4:
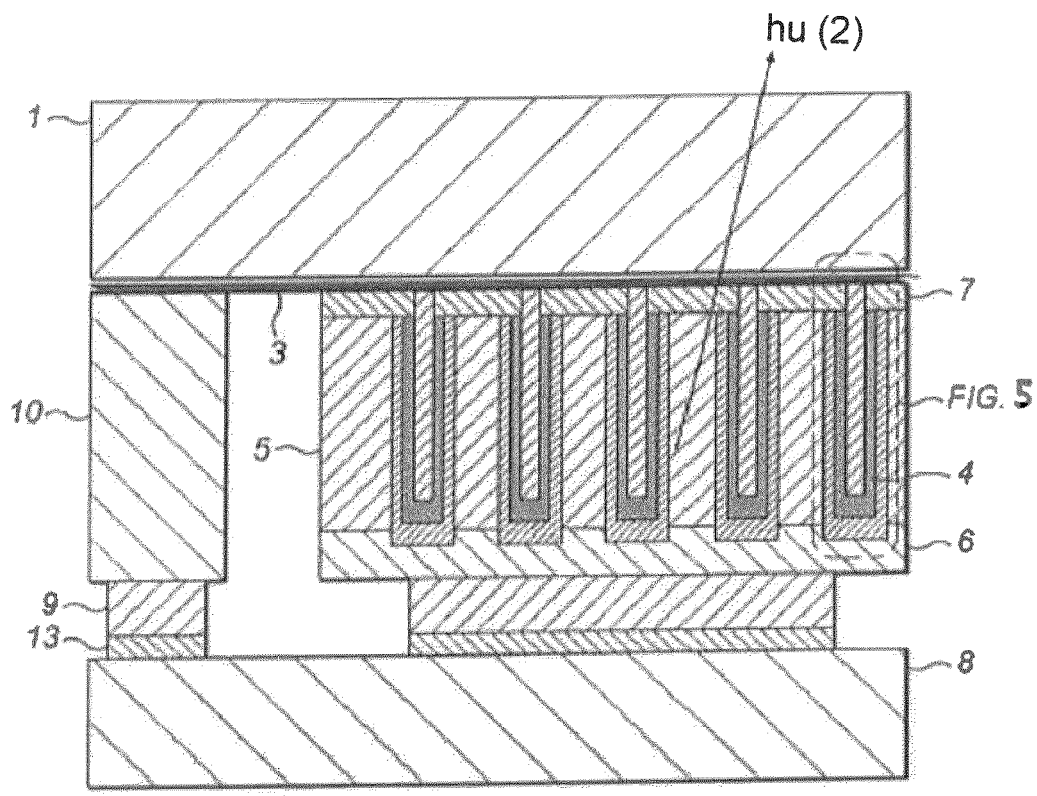

FIG. 4 shows an alternative chip design in which the nanowires are grown also radially creating core-shell structures. In use therefore, light is emitted through the top of the device (marked hv). Crystalline substrate 1 is preferably formed from sapphire or a group III-V semiconductor. In use, the substrate, if still present, is positioned upper most in the device and hence it is important that the substrate is transparent to the emitted light and thus allows light out of the device.

Layer 3 is the polycrystalline or single-crystalline graphene layer which can be one atomic layer thick or thicker, such as one which is up to 5 nm in thickness.

Nanowires 4 are grown from layer 3 epitaxially to reflect the underlying crystalline substrate. Ideally, the nanowires are formed from Al(In)GaN, AlN or GaN and are doped to create n-i-p or n-p junctions. The polycrystalline or single-crystalline graphene can be provided with a mask layer 7.

A filler 5 can be positioned between grown nanowires. A top electrode/light-reflective layer 6 is positioned on top of nanowires 4. The light-reflective layer may also be provided with a p-electrode comprising Ni or/and Au or may itself be an electrode. In use, this layer reflects any light emitted by the device to ensure that the light is emitted through the top of the device opposite the reflective layer. This is the so-called flip chip arrangement as the device is upside down compared to a conventional LED.

Electrode 10 is positioned on the polycrystalline or single-crystalline graphene layer 3. When a forward current is passed across the device, visible or UV light, dependent on composition of matter, is generated in the nanowires and is emitted, possibly after reflecting off the reflective layer out the top of the device.

The whole device is soldered to conductive tracks/pads 13 on a submount 8 via solder layer 9.

When a reverse current is passed across the device and when the device is exposed to visible or UV light, the nanowires absorb the visible or UV light, dependent on composition of matter, and converts it into current, working as a photodetector.

Figure 5:
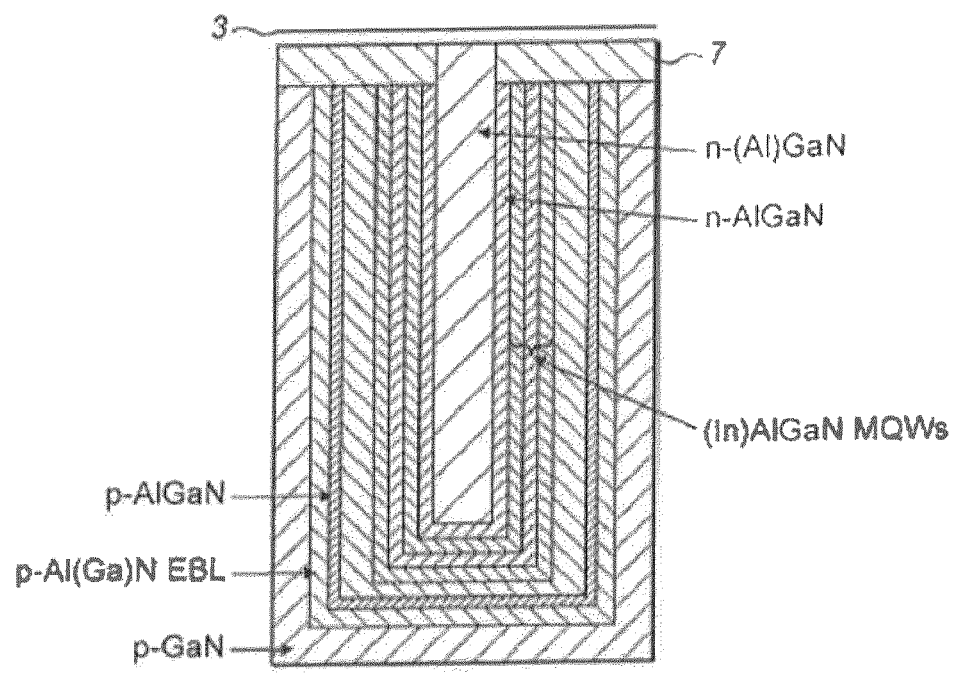

FIG. 5 shows a nanowire grown radially having the same components as those of FIG. 3 in a shell arrangement. The nanowire is provided with different components in a radial direction by variation of the elements being supplied during the growing phase. Initially, an n-type doped (Al)GaN material is deposited, followed by n-AlGaN. In the central shell of the nanowire as shown are a series of multiple quantum wells formed from (In)(Al)GaN. Then follows the p-type doped region based on AlGaN, and an electron blocking shell based on p-Al(Ga)N and finally a p-GaN shell.

Figure 6:
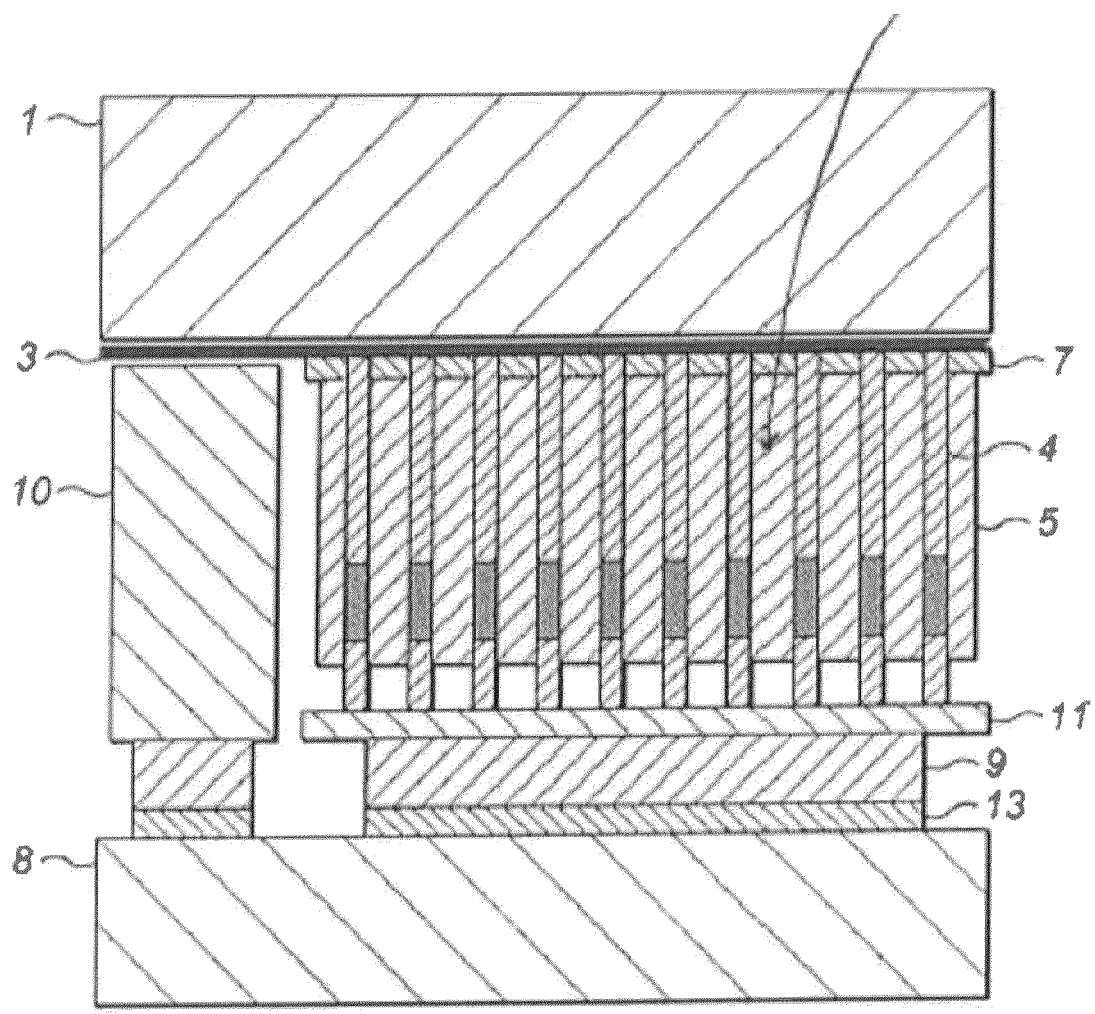

FIG. 6 shows a photodetector. In use therefore, light (2) (marked hu) is accepted through the top of the device. Crystalline substrate 1 is preferably formed from sapphire or AlN. In use, the substrate, if still present, is positioned upper most in the device and hence it is important that the support is transparent to the accepted light and thus allows light in to the device.

Layer 3 is the polycrystalline or single-crystalline graphene layer which can be one atomic layer thick.

Nanowires 4 are grown from crystalline substrate layer 3 epitaxially. Ideally, the nanowires are formed from Al(In)GaN, AlN or GaN and are doped to create n-i-p or n-p junctions.

A filler 5 can be positioned between grown nanowires. A top electrode layer 11 is positioned on top of nanowires 4. This electrode is ideally a p-electrode comprising Ni or Au.

Electrode 10 is positioned on the polycrystalline or single-crystalline graphene layer 3. The graphene layer may be provided with a mask 7 to allow growth of the nanowires in definitive positions on the polycrystalline or single-crystalline graphene.

The whole device is soldered to conductive tracks/pads 13 on a submount 8 via solder layer 9.

When a reverse current is passed across the device and when the device is exposed to visible or UV light, the nanowires absorb the visible or UV light, dependent on composition of matter, and converts it into current, working as a photodetector.

Figure 7A:
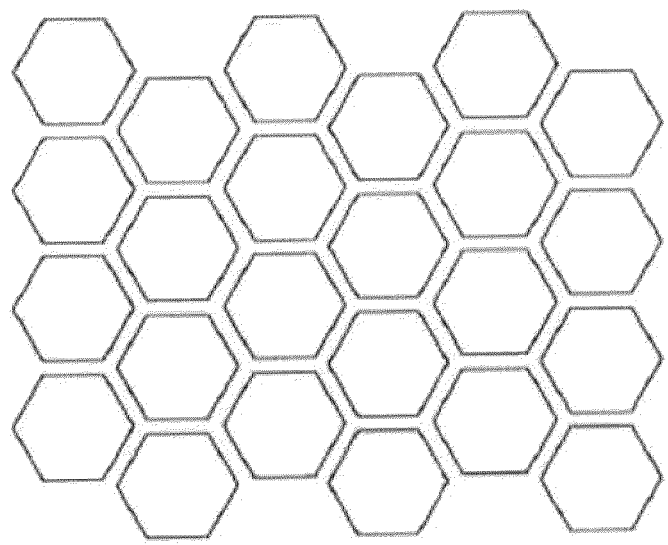

FIG. 7a is a theoretical top-view cross section of a regular hexagonal array of nanowires on polycrystalline graphene where the crystal structure of the crystalline substrate determines the nanowire orientation through remote epitaxy (nanowires have parallel facets with each other).

Figure 7B:
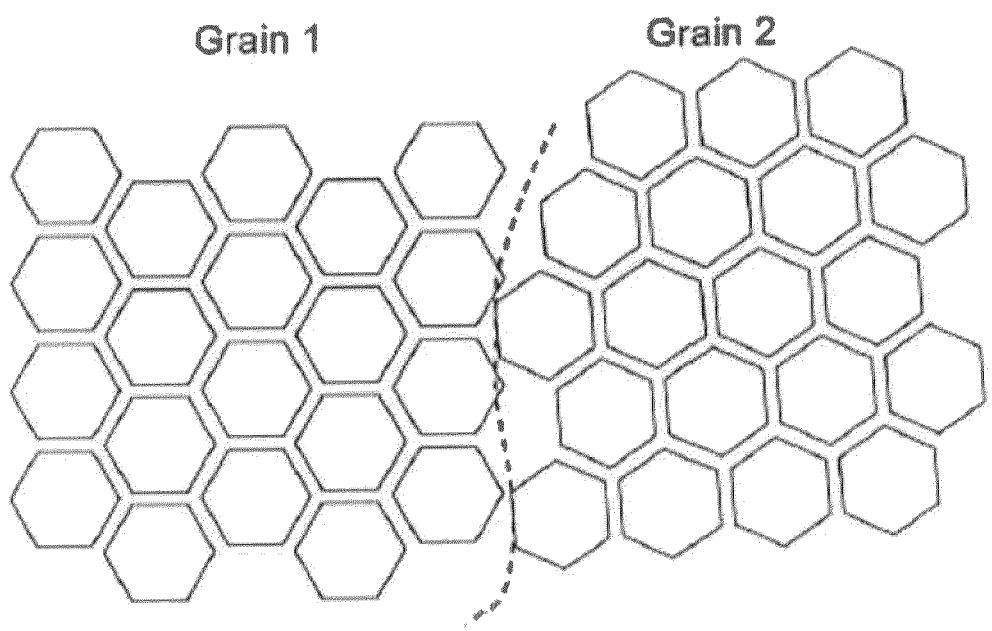

FIG. 7b is a theoretical top-view cross section of hexagonal nanowires grown on polycrystalline graphene where the crystalline substrate is unable to influence nanowire orientation. Nanowires are grown in two different domains/grains and have different facet orientations to each other. In this example, the nanowires grow epitaxially on each graphene domain/grain (nanowires on each domain/grain have the same facet orientations).

FIGS. 8-15 concern positioned nanowires/nanopyramids using graphene as a hole mask on a crystalline substrate/intermediate-layer and experimental results of LEDs fabricated using this method.

Figure 8:
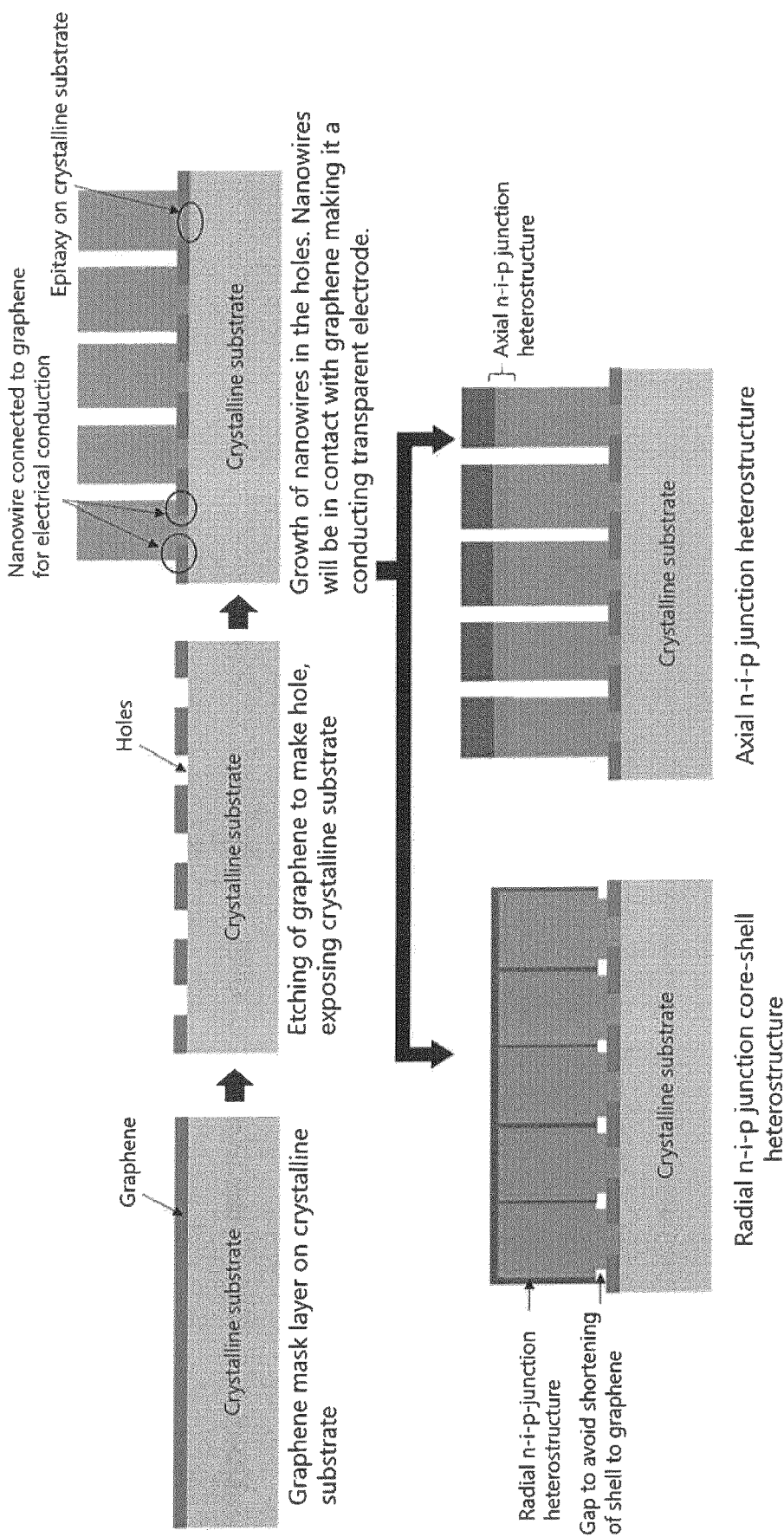

FIG. 8 (case 1.1) shows positioned flat-tip nanowires grown epitaxially on a crystalline substrate/intermediate-layer carrying a graphene mask layer through which holes have been etched. The nanowires first nucleate on the substrate/intermediate-layer epitaxially through the holes in the graphene. As the nanowires continue to grow both axially and radially, they also grow on top of the graphene layer maintaining the epitaxial relationship with the substrate/intermediate-layer. The graphene layer forms electrical contact with the nanowires both by nanowire contact with the graphene surface as well as contact with the edges of the graphene holes. Hence the graphene layer forms a conductive transparent electrode. The nanowires can be grown with either an axial or radial heterostructure in order to fabricate axial or radial n-i-p/p-i-n junction nanowire device structures, respectively. In the case of the radial n-i-p/p-i-n junction nanowire device structure, growth of the p/n nanowire shell layer on graphene must be avoided (gaps needed) to avoid shortening between n/p nanowire core and p/n nanowire shell.

Figure 9:
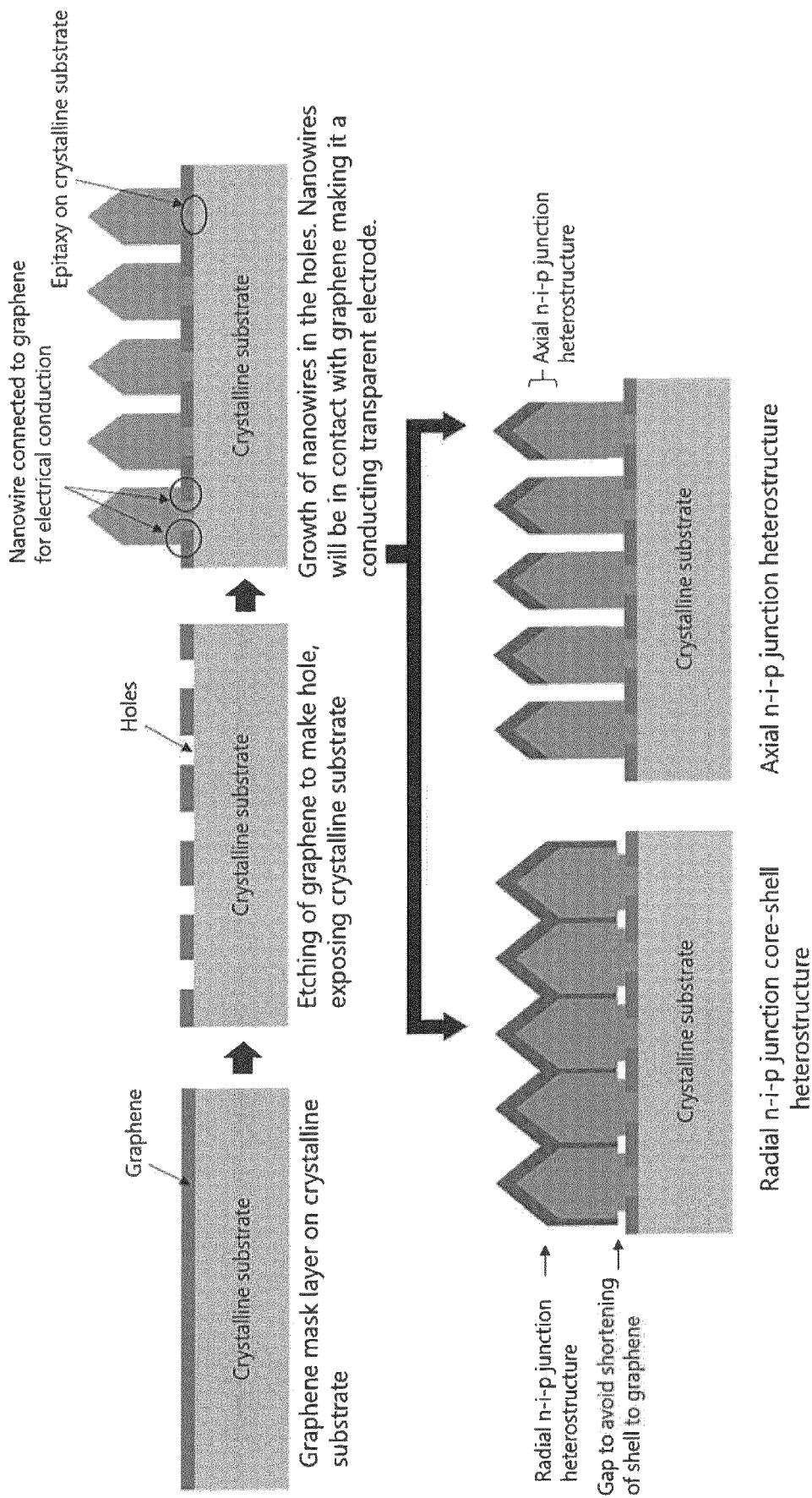

FIG. 9 (case 1.2) is analogous to FIG. 8, with the only difference being that the nanowires have a pyramidal tip. FIG. 9 shows positioned pyramid-tip nanowires grown epitaxially on a crystalline substrate/intermediate-layer carrying a graphene mask layer through which holes have been etched.

Figure 10:
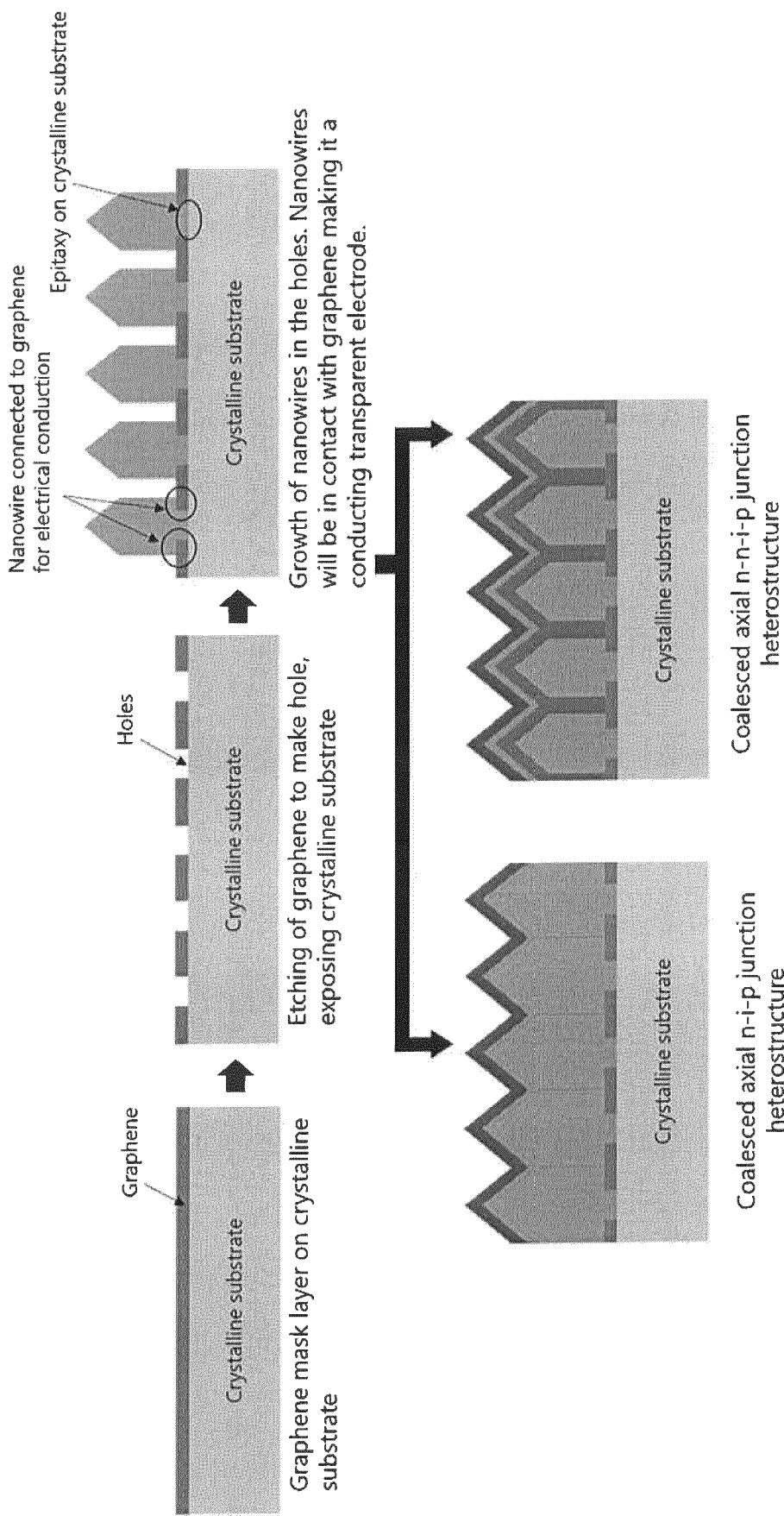

FIG. 10 (case 1.3) is analogous to the axial n-i-p junction device of FIG. 9, but the nanowires in FIG. 10 are completely coalesced as a result of the growth of an additional n-AlGaN nanowire shell layer. FIG. 10 therefore shows positioned pyramid-tip nanowires grown epitaxially on a crystalline substrate/intermediate-layer carrying a graphene mask layer through which holes have been etched, but the nanowires are completely coalesced as a result of the growth of an additional n-AlGaN nanowire shell layer.

Figure 11:
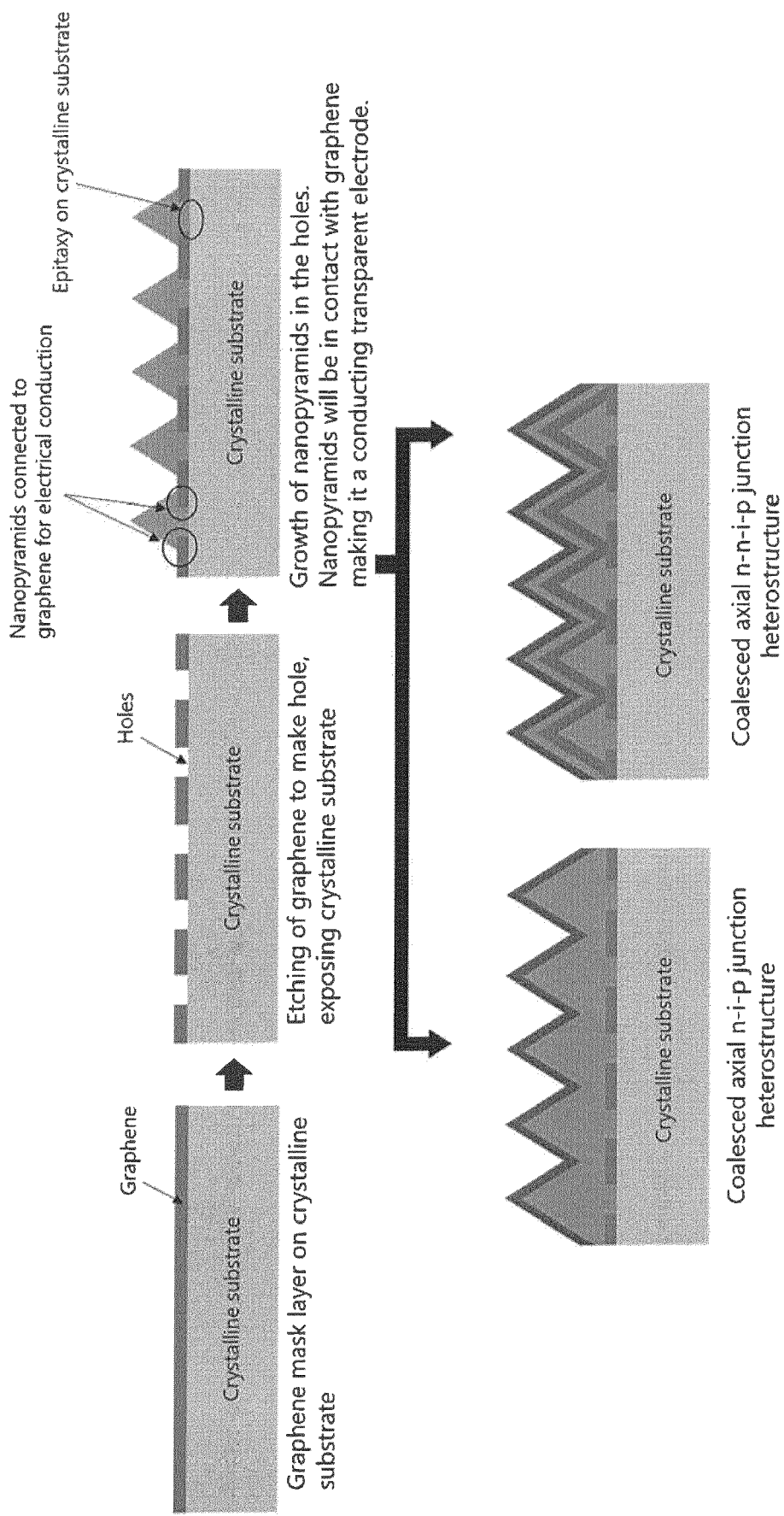

FIG. 11 (case 1.4) is analogous to FIG. 10, but with coalesced nanopyramids instead of coalesced nanowires. FIG. 11 therefore shows positioned nanopyramids grown epitaxially on a crystalline substrate/intermediate-layer carrying a graphene mask layer through which holes have been etched, and the nanopyramids are completely coalesced as a result of the growth of an additional n-AlGaN nanowire shell layer.

Figure 12:
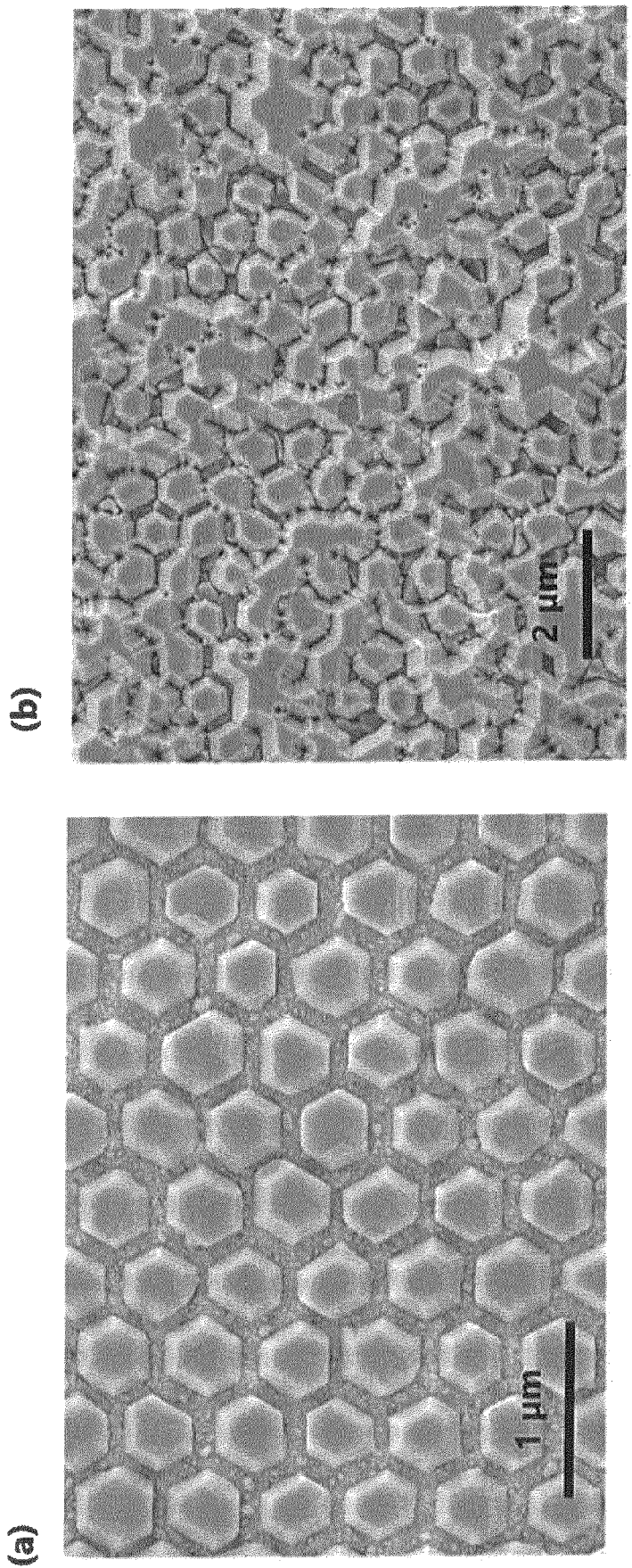

FIG. 12 depicts nanopyramid growth on a graphene hole mask layer on a sapphire (0001) substrate. The grown structure is a coalesced axial n-n-i-p junction GaN/AlGaN nanopyramid light emitting diode (LED) structure (as schematically described in FIG. 11 above). FIG. 12a is a top-view SEM image taken after the initial growth of n-AlGaN nanopyramids and FIG. 12b is a top-view SEM image taken after the complete growth of the n-AlGaN/n-AlGaN/i-GaN/p-AlGaN nanopyramid LED structure.

Figure 13:
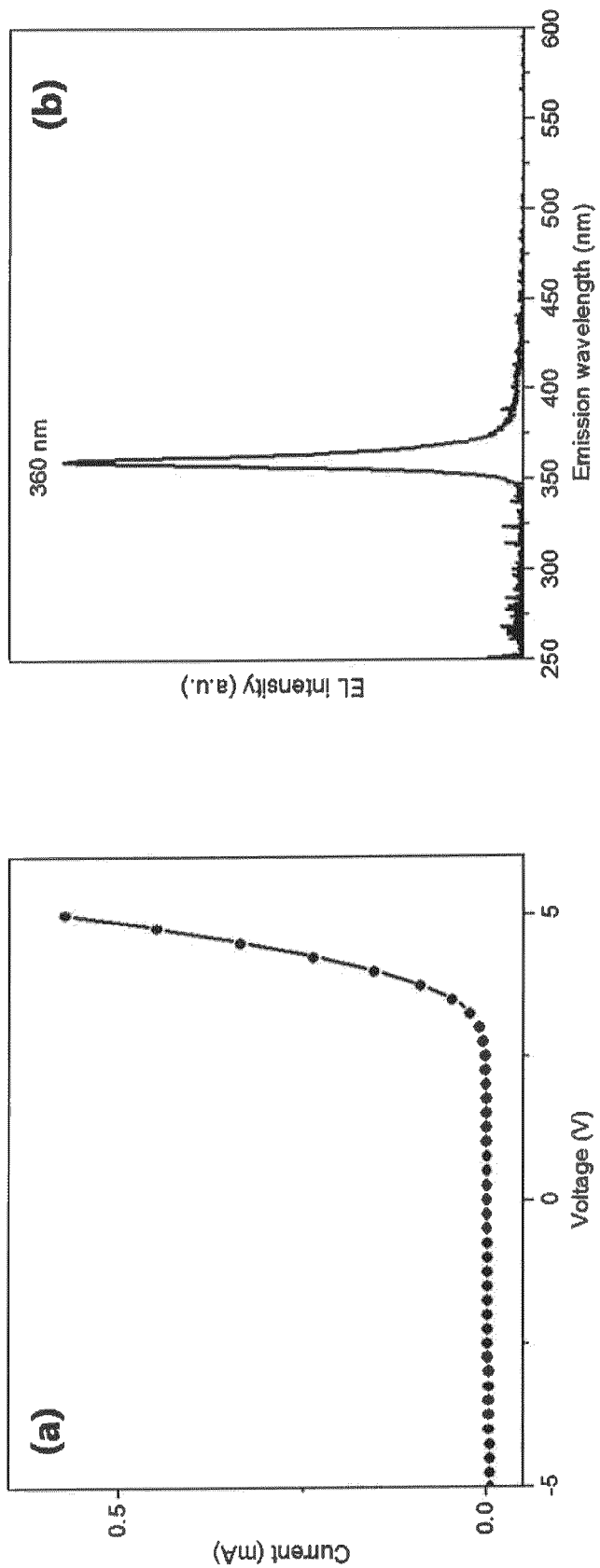

FIG. 13 demonstrates device characteristics of the sample shown in FIG. 12b processed into a flip-chip LED with a size of 50 µm×50 µm. (a) Current-voltage curve and (b) electroluminescence (EL) spectrum of the corresponding LED showing emission at 360 nm.

Figure 14:
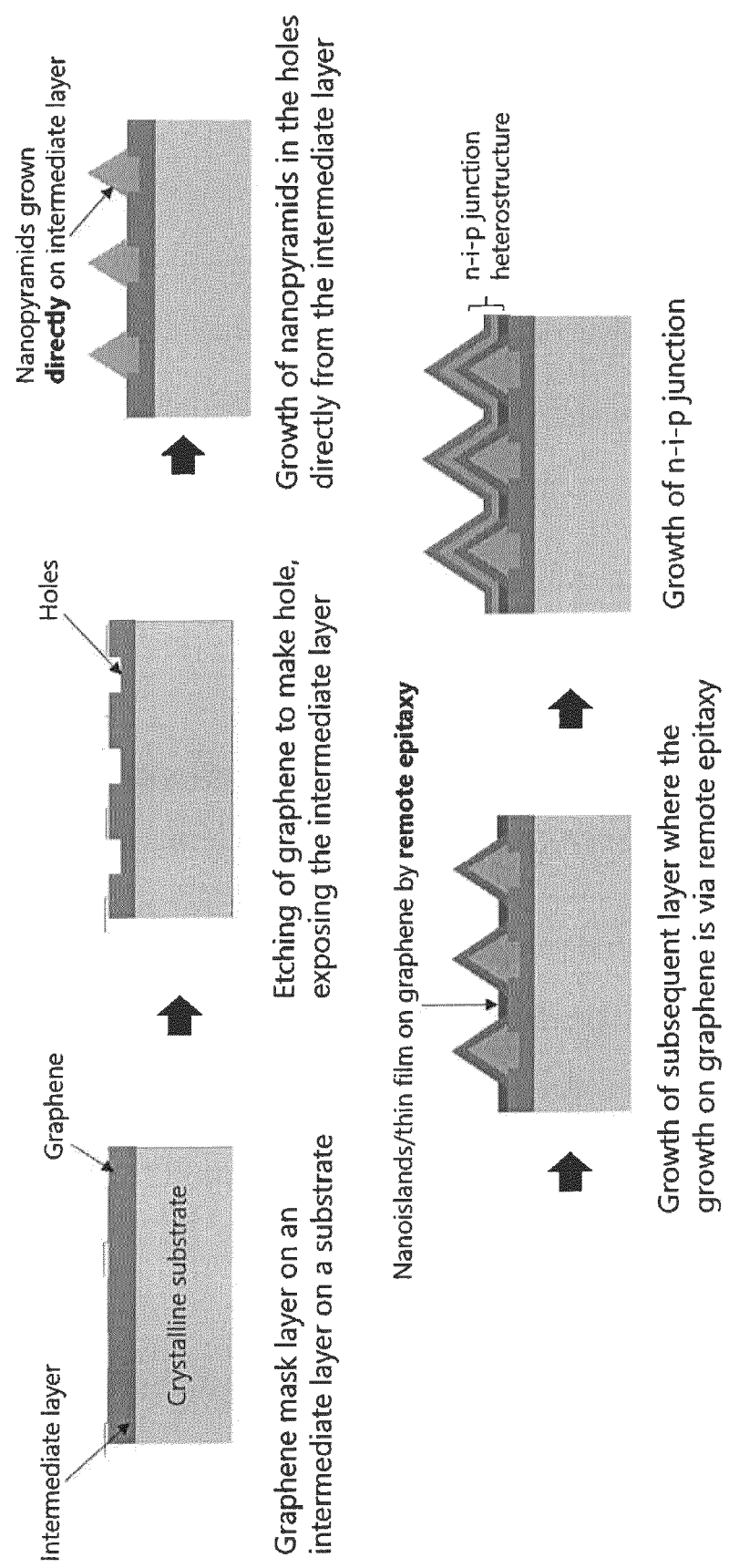

FIG. 14. Schematic illustration of growing nanopyramids (e.g. AlGaN NW) in the holes directly from the intermediate layer (e.g. AlN), and nanoislands/thin film (e.g. AlGaN) on graphene via remote epitaxy. Due to remote epitaxy, the growth on graphene will also have good crystalline quality. Subsequently, a device structure with n-i-p junction be obtained.

Figure 15D:
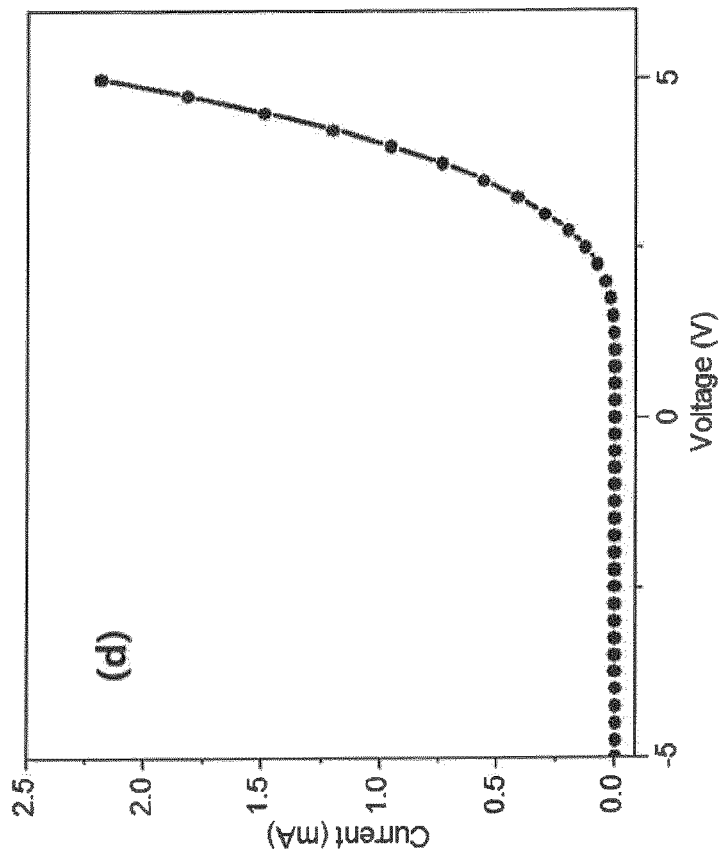

FIG. 15 depicts nanopyramid growth on a graphene hole mask layer on an AlN/sapphire (0001) substrate. The grown coalesced structure is an axial n-n-i-p junction GaN/AlGaN nanopyramid light emitting diode (LED) structure (as schematically described in FIG. 11 above). FIG. 15a is a top-view SEM image taken after the initial growth of n-GaN nanopyramids and FIG. 15b is a top-view SEM image taken after the complete growth of the n-GaN/n-AlGaN/i-GaN/p-AlGaN nanopyramid LED structure. FIG. 15c shows a top-view SEM image of seven positioned n-GaN nanopyramids showing one n-GaN triangular-based nanopyramid nucleated on the graphene mask by remote epitaxy. One can see that the nanoisland has nucleated with its three facets parallel to the facet orientation of three of the six facets of the hexagonal nanopyramid. FIG. 15d demonstrates the current-voltage curve of the sample shown in FIG. 15 processed into a flip-chip LED with a size of 50 µm×50 µm.

The invention claimed is:

1. A light-emitting diode or photodetector device comprising:
a plurality of group III-V nanowires or nanopyramids epitaxially grown on a polycrystalline or single-crystalline graphene layer,
said polycrystalline or single-crystalline graphene layer being directly supported on a crystalline substrate such as a group III-V semiconductor, sapphire, SiC, Si, $Ga_2O_3$, or diamond substrate,
wherein the epitaxy, crystal orientation, and facet orientations of said nanowires or nanopyramids are directed by the crystalline substrate;
said nanowires or nanopyramids having a p-n or p-i-n junction;
a first electrode in electrical contact with said polycrystalline or single-crystalline graphene layer;
a second electrode in contact with the top of at least a portion of said nanowires or nanopyramids, optionally in the form of a light-reflective layer;
wherein said nanowires or nanopyramids comprise at least one group III-V compound semiconductor.

2. The device as claimed in claim 1, wherein said nanowires or nanopyramids are grown through the holes of a hole-patterned mask on said polycrystalline or single-crystalline graphene layer.

3. The device as claimed in claim 1, wherein the polycrystalline or single-crystalline graphene layer is 15 Angstroms or less in thickness.

4. The device as claimed in claim 1, wherein the nanowires or nanopyramids comprise GaN, AlGaN, InGaN, or AlInGaN.

5. The device as claimed in claim 1, wherein the nanowires or nanopyramids comprise a multiple quantum well, such as an Al(In)GaN MQW.

6. The device as claimed in claim 1, wherein the nanowires or nanopyramids contain an electron blocking layer, which could be either a single barrier or a multiquantum barrier.

7. The device as claimed in claim 1, wherein the device emits or absorbs in the UV spectrum.

8. The device as claimed in claim 1, wherein the p-n or p-i-n junction within a nanowire is axial or radial.

9. The device as claimed in claim 1, wherein the nanowires or nanopyramids comprise a tunnel junction with a GaN, AlN, AlGaN, or InGaN barrier layer.

10. The device as claimed in claim 1, wherein the nanowires or nanopyramids comprise an (Al)GaN/Al(Ga)N superlattice.

11. The device as claimed in claim 1, wherein the nanowires or nanopyramids comprise AlGaN with an increasing or decreasing concentration of Al along a direction, such as axially, in the nanowire or nanopyramid.

12. The device as claimed in claim 1, wherein the nanowires or nanopyramids are doped using Si, Mg, Zn, or Be.

13. The device as claimed in claim 1, wherein the space between the nanowires or nanopyramids is filled by a supporting and electrically isolating filler material transparent to the light emitted or absorbed in said device.

14. The device as claimed in claim 1, wherein, in use, light is emitted or absorbed in a direction substantially parallel to but opposite from the growth direction of the nanowires.

15. The device as claimed in claim 1, wherein said polycrystalline or single-crystalline graphene layer is a polycrystalline graphene layer.

* * * * *